United States Patent

Eldridge et al.

[11] Patent Number: 6,043,563
[45] Date of Patent: Mar. 28, 2000

[54] ELECTRONIC COMPONENTS WITH TERMINALS AND SPRING CONTACT ELEMENTS EXTENDING FROM AREAS WHICH ARE REMOTE FROM THE TERMINALS

[75] Inventors: Benjamin N. Eldridge, Danville; Igor Y. Khandros, Orinda; Gaetan L. Mathieu, Livermore; David V. Pedersen, Scotts Valley, all of Calif.

[73] Assignee: FormFactor, Inc., Livermore, Calif.

[21] Appl. No.: 08/955,001

[22] Filed: Oct. 20, 1997

Related U.S. Application Data

[63] Continuation-in-part of application No. 08/852,152, May 6, 1997, and a continuation-in-part of application No. PCT/US97/08634, May 15, 1997
[60] Provisional application No. 60/051,366, Jun. 30, 1997.
[51] Int. Cl.⁷ .......................... H01L 23/48; H01L 23/52; H01L 29/40
[52] U.S. Cl. ............................. 257/784; 257/773
[58] Field of Search ..................... 257/780, 781, 257/783, 784, 773, 765, 762, 771, 766

[56] References Cited

U.S. PATENT DOCUMENTS

| | | | |
|---|---|---|---|
| 4,893,172 | 1/1990 | Matsumoto et al. | 257/669 |
| 5,055,780 | 10/1991 | Takagi et al. | 324/158 F |
| 5,086,337 | 2/1992 | Noro et al. | 357/79 |
| 5,191,708 | 3/1993 | Kasukabe et al. | 29/846 |
| 5,354,712 | 10/1994 | Ho et al. | 437/195 |
| 5,495,667 | 3/1996 | Farnworth et al. | 257/780 |
| 5,602,422 | 2/1997 | Schuller et al. | 257/780 |
| 5,629,565 | 5/1997 | Schlaak et al. | 257/780 |
| 5,810,609 | 9/1998 | Faraci et al. | 257/780 |
| 5,852,871 | 12/1998 | Khandros . | |
| 5,864,946 | 2/1999 | Eldridge et al. . | |
| 5,926,951 | 7/1999 | Khandros et al. . | |

FOREIGN PATENT DOCUMENTS

| | | | |
|---|---|---|---|
| WO 96/15458 | 5/1996 | WIPO | G10R 1/073 |
| WO 96/15459 | 5/1996 | WIPO | G01R 1/073 |

OTHER PUBLICATIONS

Robust Method Using Simple Unit Processes For Thin Film Cu–Polyimide Packaging Structures, IBM Technical Disclosure Bulletin, vol. 34, No. 10A, Mar. 1, 1992, pp. 368–369, XP 000302335.

Primary Examiner—Sheila V. Clark
Attorney, Agent, or Firm—David Larwood; Gerald E. Linden

[57] ABSTRACT

Spring contact elements are fabricated at areas on an electronic component remote from terminals to which they are electrically connected. For example, the spring contact elements may be mounted to remote regions such as distal ends of extended tails (conductive lines) which extend from a terminal of an electronic component to positions which are remote from the terminals. In this manner, a plurality of substantially identical spring contact elements can be mounted to the component so that their free (distal) ends are disposed in a pattern and at positions which are spatially-translated from the pattern of the terminals on the component. The spring contact elements include, but are not limited to, composite interconnection elements and plated-up structures. The electronic component includes, but is not limited to, a semiconductor device, a memory chip, a portion of a semiconductor wafer, a space transformer, a probe card, a chip carrier, and a socket.

32 Claims, 14 Drawing Sheets

800

850

1300

1300

1400

1450

ELECTRONIC COMPONENTS WITH TERMINALS AND SPRING CONTACT ELEMENTS EXTENDING FROM AREAS WHICH ARE REMOTE FROM THE TERMINALS

CROSS-REFERENCE TO RELATED APPLICATIONS:

This patent application is a continuation-in-part of commonly-owned, copending U.S. Provisional Patent Application Ser. No. 60/051,366 filed Jun. 30, 1997, which is also a continuation-in-part of commonly-owned, U.S. patent application Ser. No. 08/852,152 filed May 6, 1997 (status: pending) and its counterpart PCT Patent Application No. US97/08634 filed May 15, 1997 (status: pending)

TECHNICAL FIELD OF THE INVENTION

The present invention relates to resilient (spring) contact (interconnection) elements (structures) suitable for effecting connections between electronic components and, more particularly, to microminiature spring contact elements.

BACKGROUND OF THE INVENTION

Commonly-owned U.S. patent application Ser. No. 08/152,812 filed Nov. 16, 1993 (now U.S. Pat. No. 5,476, 211, issued Dec. 19, 1995), and its counterpart commonly-owned copending "divisional" U.S. patent applications Ser. Nos. 08/457,479 filed Jun. 1, 1995 (status: pending) and 08/570,230 filed Dec. 11, 1995 (status: pending), disclose methods for making resilient interconnection elements (spring contact elements) for microelectronics applications involving mounting an end of a flexible elongate core element (e.g., wire "stem" or "skeleton") to a terminal on an electronic component, coating the flexible core element and adjacent surface of the terminal with a "shell" of one or more materials having a predetermined combination of thickness, yield strength and elastic modulus to ensure predetermined force-to-deflection characteristics of the resulting spring contacts. Exemplary materials for the core element include gold. Exemplary materials for the coating include nickel and its alloys. The resulting spring contact element is suitably used to effect pressure, or demountable, connections between two or more electronic components, including semiconductor devices.

Commonly-owned, copending U.S. patent application Ser. No. 08/340,144 filed Nov. 15, 1994 (status: pending) and its corresponding PCT Patent Application No. PCT/US94/13373 filed Nov. 16, 1994 (published as WO95/14314 May 26, 1995, pending), both by KHANDROS and MATHIEU, disclose a number of applications for the aforementioned spring contact elements, and also discloses techniques for fabricating contact pads (contact tip structures) at the ends of the spring contact elements.

Commonly-owned, copending U.S. patent application Ser. No. 08/452,255 filed May 26, 1995 (status: pending) and its corresponding PCT Patent Application No. PCT/US95/14909 filed Nov. 13, 1995 (published as WO96/17278 Jun 6, 1996, pending) disclose additional techniques and metallurgies for fabricating spring contact elements as composite interconnection structures and for fabricating and mounting contact tip structures to the free ends (tips) of the composite interconnection elements.

Commonly-owned, copending U.S. patent application Ser. No. 08/819,464 filed Mar 17, 1997 (status: pending) and its counterpart PCT Patent Application No. US97/08606 filed May 15, 1997 (status: pending) disclose a technique whereby a plurality of elongate tip structures having different lengths than one another can be arranged so that their outer ends are disposed at a greater pitch than their inner ends. Their inner, "contact" ends may be collinear with one another, for effecting connections to electronic components having terminals disposed along a line, such as a centerline of the component. Additional contact tip structure methods and apparatus are disclosed in these patent commonly-owned applications.

The present invention addresses and is particularly well-suited to making interconnections to modern microelectronic devices (components) having their terminals (bond pads) disposed at a fine-pitch. As used herein, the term "fine-pitch" refers to microelectronic devices that have their terminals disposed at a spacing of less than 5 mils, such as 2.5 mils or 65 $\mu$m. As will be evident from the description that follows, this is preferably achieved by taking advantage of the close tolerances that readily can be realized by using lithographic rather than mechanical techniques to fabricate the contact elements.

SUMMARY OF THE INVENTION

An object of the present invention is to provide an improved technique for fabricating spring contact elements.

Another object of the invention is to provide a technique for fabricating spring contact elements using processes that are inherently well-suited to the fine-pitch close-tolerance world of microelectronics.

Another object of the invention is to provide a technique for fabricating microminiature spring contact elements directly on active electronic components, such as semiconductor devices, without damaging the semiconductor devices. This includes fabricating microminiature spring contact elements on semiconductor devices resident on a semiconductor wafer, prior to their being singulated therefrom.

Another object of the invention is to provide a technique for fabricating spring contact elements that are suitable for socketing (releasably connecting to) electronic components such as semiconductor devices, such as for performing burn-in on said devices.

Another object of the invention is to provide a technique for fabricating spring contact elements which provide space translation of the terminals of an electronic component to which they are mounted. As used herein, the term "space translation" means that the tips (distal ends) of the spring contact elements are disposed at different spacing (pitch) and/or orientation than the terminals of the electronic component to which they are connected.

According to the invention, a spring contact element is fabricated on an electronic component such as an active semiconductor device, a memory chip, a portion of a semiconductor wafer, a space transformer, a probe card, a chip carrier, or a socket, at a position on the electronic component which is remote (spatially translated) from a terminal to which it is electrically connected. The electrical connection between the spring contact element and the terminal is suitably a conductive line originating at the terminal. The spring contact element is free-standing, having a base end which is mounted to the electronic component, such as at a position on the conductive line which is remote from the terminal, a contact (tip) end, and a resilient main body portion between the base end and the tip end.

The spring contact elements are any resilient, freestanding contact structures. An example of a resilient, freestanding contact structure is disclosed in commonly-owned U.S. Pat. No. 5,476,211 issued Dec. 19, 1995, which is incorporated by reference herein. Another example of a resilient, free-standing contact structure is disclosed in commonly-owned, copending U.S. patent application Ser. No. 08/802,054 filed Feb. 18, 1997 (status: pending) and its counterpart PCT Patent Application No. US97/08271 filed May 15, 1997 (status: pending), as well as in the aforementioned US97/08634.

According to an aspect of the invention, a plurality spring contact elements are mounted to an electronic component and electrically connected to a corresponding plurality of terminals on the electronic component in a manner to effect "space translation"—in other words, so that the layout and/or pitch of the component terminals is different than the layout and/or pitch of the tips of the spring contact elements. For example, the terminals of the electronic component are disposed at a first pitch in a peripheral pattern and the tips of the spring contact elements are disposed in an area array at a second pitch, or vice-versa.

The aforementioned U.S. patent application Ser. No. 08/340,144 and PCT Patent Application No. US94/13373 disclose a one type of pitch-translation which is effected by shaping selected ones of the free-standing resilient contact structures differently than other one of the free-standing resilient contact structures. See FIGS. 23 and 24 therein. Such a technique has the drawback that different "style" spring contact elements need to be designed, manufactured and mounted to a single electronic component. This can cause problems in processing, particularly if certain steps in the manufacturing process have narrow process windows.

According to an aspect of the invention, a plurality of spring contact elements are manufactured so that they are substantially similar (such as identical) to one another, and space-translation is effected by tailoring a relatively process-insensitive part of the overall spring contact elements. To wit, at least some of, including all of, the spring contact elements on a given electronic component are provided with elongate "tails", which may be conductive lines extending from the base end of the spring contact element to the terminal of the electronic component to which it is electrically connected.

In an embodiment of the invention, the tails are elongate conductive lines formed using conventional semiconductor processing techniques extending along the surface of the component. A one (proximal) end of the conductive line overlies a terminal (e.g., bond pad) of the electronic component and is joined thereto. The base end of a spring contact element is joined to an other position on the conductive line, such as at the remote (distal) end of the conductive line. This embodiment is suited to fabricating spring contact elements which are composite interconnection elements directly upon the conductive line which effects space translation. This embodiment is also suited to joining pre-fabricated spring contact elements to the remote positions on the conductive lines.

In another embodiment of the invention, the tails are elongate conductive lines formed using conventional semiconductor processing techniques extending along the surface of the component. A one (proximal) end of the conductive line overlies a terminal (e.g., bond pad) of the electronic component. The base end of a spring contact element is integrally formed with an other remote (distal) end of the conductive line. This embodiment is well suited to manufacturing spring contact elements which are plated-up structures and the elongate conductive line tails extending to terminals of the electronic component in one fell swoop.

According to an aspect of the invention, the tails of the spring contact elements can extend in a straight line (linearly) along the surface of the electronic component to the base end of the spring contact element to effect "simple" space-translation such as fan-out (or fan-in). Or, the tails of the spring contact elements can "wander" (or meander) along the surface of the electronic component including, if necessary crossing over one another to effect more complex space-translation schemes.

A benefit of the present invention is that the contact layout of an existing electronic component can be modified, after the electronic component has already been completely manufactured. For example, a completed (finished) semiconductor device has a number of bond pad terminals accessible on a surface thereof through openings in a passivation layer. If a plurality of identical spring contact elements were mounted to or fabricated upon those terminals, the tips of the spring contact elements would mirror the layout of the bond pads. The present invention essentially "relocates" the terminals (at least a portion thereof) so that the tips of the spring contact elements can have a completely different layout than the bond pads of the semiconductor device. The tails or conductive lines of the present invention have a proximal end which is directly atop an existing terminal of an existing electronic component and a remote region (such as a distal end) which, in essence, serves as a "relocated terminal" for the electronic component.

The spring contact elements of this invention are suitable for making either temporary or permanent electrical connections to terminals of another electronic component such as a printed circuit board (PCB) interconnection substrate.

For making temporary connections, the component upon which the spring contact elements are fabricated is brought together with another electronic component so that the tip ends of the spring contact elements are in pressure contact with terminals of the other electronic component. The spring contact elements react resiliently to maintain contact pressure and electrical connections between the two components.

For making permanent connections, the component upon which the spring contact elements are fabricated is brought together with another electronic component, and the tip ends of the spring contact elements are joined, such as by soldering or brazing or with a conductive adhesive, to terminals of the other electronic component. The spring contact elements are compliant, and accommodate differential thermal expansion between the two electronic components.

The spring contact element is suitably formed of at least one layer of a metallic material selected for its ability to cause the resulting contact structure to function, in use, as a spring (i.e., exhibit elastic deformation) when force is applied to its contact (free) end.

The spring contact elements of the present invention can be fabricated directly on the surface of a semiconductor device, or on the surfaces of a plurality of semiconductor devices resident on a semiconductor wafer. In this manner, a plurality of semiconductor devices resident on a semiconductor wafer can be "readied" for burn-in and/or test prior to being singulated from the semiconductor wafer.

Other objects, features and advantages of the invention will become apparent in light of the following description thereof.

BRIEF DESCRIPTION OF THE DRAWINGS

Reference will be made in detail to preferred embodiments of the invention, examples of which are illustrated in the accompanying drawings. The drawings are intended to be illustrative, not limiting. Although the invention will be described in the context of these preferred embodiments, it should be understood that it is not intended to limit the spirit and scope of the invention to these particular embodiments. Certain elements in selected ones of the drawings are illustrated not-to-scale, for illustrative clarity. Often, similar elements throughout the drawings are referred to by similar references numerals. For example, the element 199 may be similar in many respects to the element 299 in another figure. Also, often, similar elements are referred to with similar numbers in a single drawing. For example, a plurality of elements 199 may be referred to as 199*a*, 199*b*, 199*c*, etc.

DETAILED DESCRIPTION OF THE INVENTION

The section headings appearing in the description that follows are included as an aid to the reader, and are not to be construed in a limiting manner.

An Exemplary Spring Contact Element

The aforementioned commonly-owned U.S. Pat. No. 5,476,211 and PCT Patent Application No. US94/13373 disclose techniques for fabricating elongate free-standing resilient contact structures (spring contact elements which are composite interconnection elements) on electronic components by bonding and shaping an elongate core element (e.g., a gold wire) on a terminal of the component and overcoating the free-standing core element and an adjacent area (e.g., the terminal) of the component with a metallic material which dominates the mechanical characteristics of the resulting composite interconnection element and securely anchors the resulting composite interconnection element to the terminal of the component.

Figure 1A:
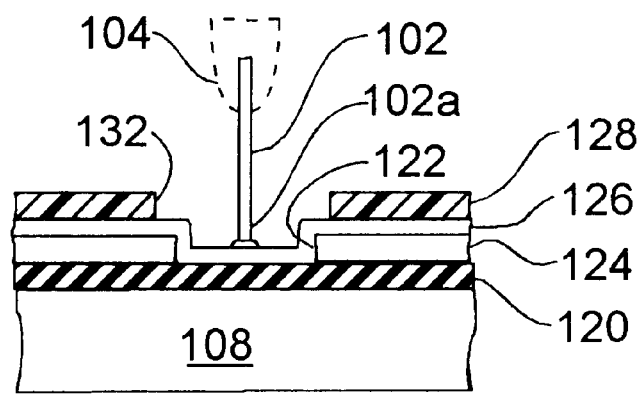
FIG. 1A is a side cross-sectional view of a technique for making a spring contact element which is a composite interconnection element, according to the invention.
Figure 1B:
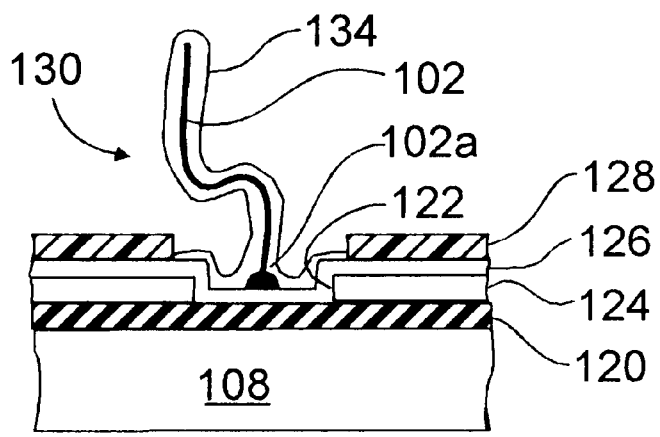
FIG. 1B is a side cross-sectional view of a further step in the technique for making the spring contact element of FIG. 1A, according to the invention.
Figure 1C:
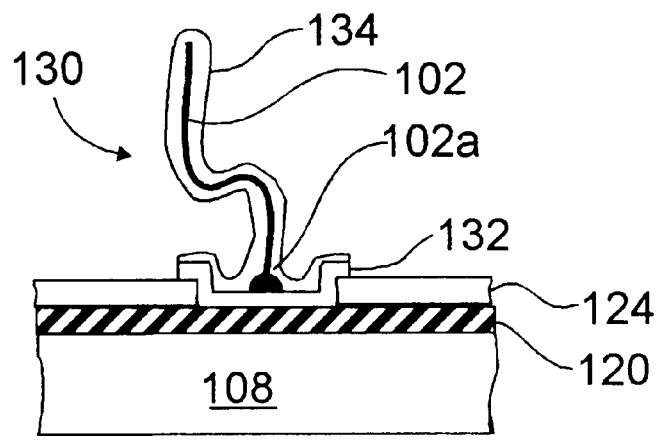
FIG. 1C is a side cross-sectional view of a further step in the technique for making the spring contact element of FIG. 1B, according to the invention.

The aforementioned PCT Patent Application No. US95/14909 discloses, at FIGS. 1C, 1D and 1E thereof, reproduced herein as FIGS. 1A, 1B and 1C, discloses an exemplary technique for fabricating spring contact elements of the aforementioned composite interconnection type on electronic components which are semiconductor devices. This technique is also disclosed at FIGS. 3A, 3B and 3C of commonly-owned, copending PCT Patent Application No. US95/14885 filed Nov. 15, 1995 (published May 23, 1996 as WO96/15459).

FIGS. 1A, 1B and 1C illustrate an exemplary technique for fabricating resilient, elongate, free-standing spring contact elements which are composite interconnection elements on an electronic component 108 which is a semiconductor device wherein a free end 102a of a wire 102 is fed through a capillary 104 and is bonded to a surface of the semiconductor device 108. In this technique, a conductive layer 120 is first disposed on the surface of the component 108. This layer 120 may be a top metal layer, which is normally intended for bond-out, as defined by openings 122 in a passivation layer 124 (typically nitride). In this manner, a bond pad would be defined which would have an area corresponding to the area of the opening 122 in the passivation layer 124. Normally (i.e., according to the prior art), a wire would be bonded to the bond pad. A blanket layer 126 of metallic material (e.g., aluminum) is deposited over the passivation layer 124 in a manner that the conductive layer 126 conformally follows the topography of the passivation layer 124, including "dipping" into the opening 122 and electrically contacting the layer 120. A patterned layer 128 of photoresist is applied over the layer 126 with openings 132 aligned over the openings 122 in the passivation layer 124. A feature of this technique is that the opening 132 is larger than the opening 122. This results in a larger bond area (defined by the opening 132) than is otherwise (as defined by the opening 122) present on the semiconductor die (108). The free end 102a of the wire 102 is bonded to the top (as viewed) surface of the conductive layer 126, within the opening 132. Next the wire is configured to have a spring shape and is severed to create a free-standing "wire stem". Next, the wire stem and adjacent area of the component 108 within the opening 132 is overcoated (e.g., plated) with one or more layers of a metallic material (e.g., nickel), resulting in a spring contact element which is a freestanding elongate composite interconnection structure. As shown in FIGS. 1B and 1C, the material 134 overcoating the wire stem completely envelops the wire stem and also covers the conductive layer 126 within the area defined by the opening 132 in the photoresist 128. The photoresist 128 is then removed (such as by chemical etching, or washing), and the substrate is subjected to selective etching (e.g., chemical etching) to remove all of the material from the conductive layer 126 except that portion of the layer 126 which is covered by the material 134 overcoating the wire stem. This results in the structure shown in FIG. 1C, a significant advantage of which is that the resulting spring contact element 130 is securely anchored (by the coating material 134) to an area (which was defined by the opening 132 in the photoresist) which can easily be made to be larger than what would otherwise (e.g., in the prior art) be considered to be the contact area of a bond pad (i.e., the opening 122 in the passivation layer 124). The spring contact element 130 shown in FIG. 1C is a composite interconnection element which is elongate and has a base (proximal) end which is mounted to the semiconductor device 108 and free (distal) end (tip) at its opposite end for making a pressure contact with a terminal (not shown) of another electronic component (not shown).

Exemplary materials, processes and dimensions

Exemplary materials for the wire 102 include, but are not limited to: gold, aluminum, copper, and their alloys. These materials are typically alloyed with small amounts of other metals to obtain desired physical properties, such as with beryllium, cadmium, silicon, magnesium, and the like. It is also possible to use silver, palladium, platinum; metals or alloys such as metals of the platinum group of elements. Solder constituted from lead, tin, indium, bismuth, cadmium, antimony and their alloys can be used.

Exemplary materials for the overcoat 134 include, but are not limited to: nickel, and its alloys; copper, cobalt, iron, and their alloys; gold (especially hard gold) and silver, both of which exhibit excellent current-carrying capabilities and good contact resistivity characteristics; elements of the platinum group; noble metals; semi-noble metals and their alloys, particularly elements of the palladium group and their alloys; tungsten and molybdenum. In cases where a solder-like finish is desired, tin, lead, bismuth, indium and their alloys can also be used.

Exemplary processes for overcoating the core element (wire stem) 102 include, but are not limited to: various processes involving deposition of materials out of aqueous solutions; electrolytic plating; electroless plating; chemical vapor deposition (CVD); physical vapor deposition (PVD); processes causing the deposition of materials through induced disintegration of liquid or solid precursors; and the like, all of these techniques for depositing materials being generally well known.

Exemplary dimensions for the wire 102 are, but are not limited to: a round cross-section wire having a diameter of approximately 1 mil (0.0010 inches) including, but not limited to a diameter in the range of 0.7–2.0 mils, preferably in the range of 0.5–3.0 mils.

It is within the scope of this invention that the wire 102 is in the form of a ribbon, having a non-circular cross-section, of the above-referenced materials. For example, it may be generally rectangular in cross-section, having a first transverse dimension "d1" greater than a second transverse dimension "d2" in a direction orthogonal to the first dimension "d1". The dimension "d1" is preferably at least twice (two times) as large (including three, four, and more) as the dimension "d2". For example:

the dimension "d1" (or width) may be 1–10 mils, for example 5.0 mils; and the dimension "d2" (or thickness) may be 0.3–1.5 mils, for example 1.0 mils.

Exemplary dimensions for the various layers of a multi-layer overcoat 134 are, but are not limited to 0.03 to 5 mils, preferably from 0.05 mils to 3 mils, an overall thickness of the overcoat being on the order of 1–3 mils.

Another Exemplary Spring Contact Element

Commonly-owned, copending U.S. patent application Ser. No. 08/784,862 filed Jan. 15, 1997 (status: pending) and its counterpart PCT Patent Application No. US97/08604 filed May 15, 1997 (status: pending) disclose, for example at FIGS. 6A–6C thereof, a technique for fabricating free-standing resilient (spring) contact elements on an electronic component. Generally, a number of insulating layers having openings formed therein are aligned and "seeded" with a layer of conductive material. A mass of conductive material can then be formed (or deposited) in the seeded opening(s), such as by electroplating (or CVD, sputtering, electroless plating, etc.). After the insulating layers are removed, the masses can function as free-standing resilient contact structures which extend not only vertically above the surface of the component, but also laterally from the location whereat they are mounted. In this manner, the contact structures are readily engineered to be compliant in both the Z-axis as well as in the x-y plane (parallel to the surface of the component). This is described in greater detail hereinbelow with respect to FIGS. 2A–2C.

Figure 2A:
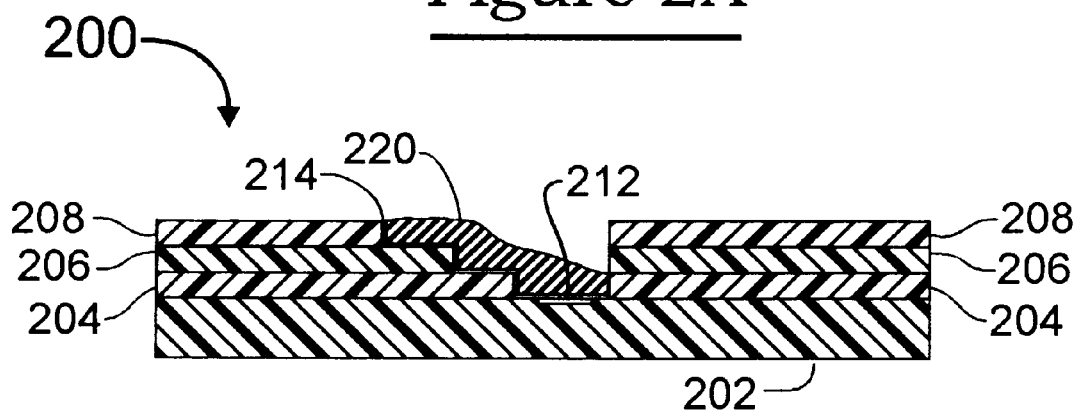
FIG. 2A is a side cross-sectional view of a technique for making a spring contact element which is a plated-up structure, according to the invention.

FIG. 2A illustrates an exemplary technique 200 for fabricating one of a plurality of free-standing resilient (spring) contact elements on a substrate 202 which may be an active electronic component, including semiconductor devices such as memory chips, including semiconductor devices resident on a semiconductor wafer (not shown).

The substrate 202 has a plurality (one of may shown) or areas 212 on its surface whereat the spring contact elements will be fabricated. In the case of the substrate 202 being an electronic component (such as a semiconductor device), these areas 212 would be terminals (such as bond pads) of the electronic component.

Generally, the technique 200 involves applying a number (three shown) of patterned masking layers 204, 206 and 208 having openings onto the surface of the substrate. The layers are patterned to have openings (as shown) aligned with the areas 212, and the openings are sized and shaped so that an opening in a one layer (e.g., 208, 206) extends further from the area 212 than an opening in an underlying layer (e.g., 206, 204, respectively). In other words, the first layer 204 has an opening which is directly over the area 212. A portion of the opening in the second layer 206 is aligned over at least a portion of the opening in the first layer 204 and, conversely, a portion of the first layer 204 extends under a portion of the opening in the second layer 206. Similarly, a portion of the opening in the third layer 208 is aligned over at least a portion of the opening in the second layer 206 and, conversely, a portion of the second layer 206 extends under a portion of the opening in the third layer 208. The bottom portion of a given overall opening is directly over the selected area 212 and its top portion is elevated and laterally offset from its bottom portion. As will be discussed in greater detail hereinbelow, a conductive metallic material is deposited into the openings, and the masking layers are removed, resulting in a freestanding contact structure having been fabricated directly upon the substrate with its base end secured to the substrate 202 at the area 212 and its free end extending both above the surface of the substrate and laterally-displaced from the area 212.

If required, such as for electroplating, a very thin (e.g., 450 $\mu$m) "seed" layer of conductive material 214 such as titanium/tungsten (TiW) may be deposited into the openings. Then, a mass of conductive metallic material (e.g., nickel) 220 can be deposited by electroplating into the openings.

Figure 2B:
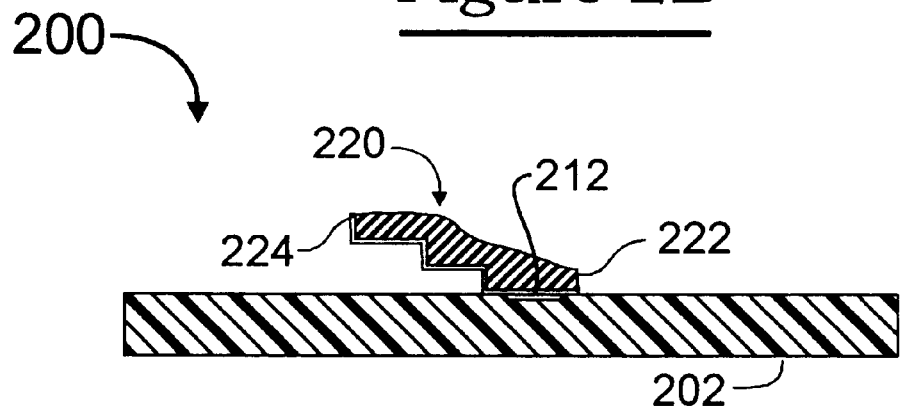
FIG. 2B is a side cross-sectional view of a further step in the technique for making the spring contact element of FIG. 2A, according to the invention.
Figure 2C:
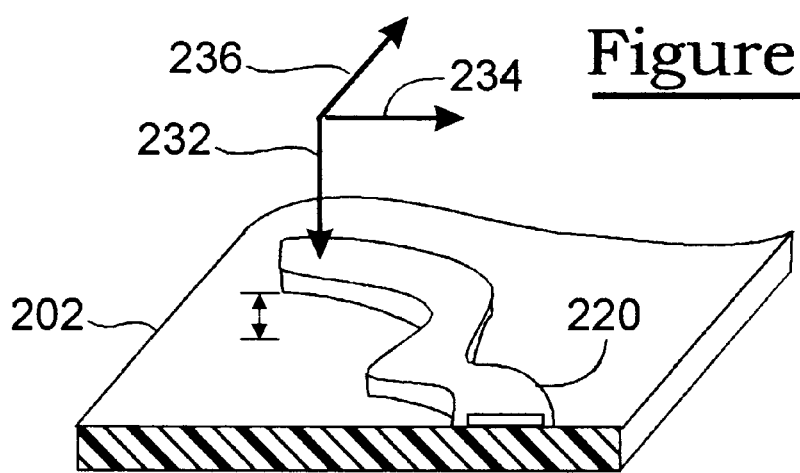
FIG. 2C is a perspective view of a further step in the technique for making the spring contact element of FIG. 2B, according to the invention.

FIGS. 2B and 2C illustrate a resulting spring contact element 220 having its base (proximal) end 222 adjacent the area 212, and its free-end (tip) 224 elevated in the z-axis above the surface of the substrate 202 as well as laterally offset in the x-axis and y-axis from the base end 222.

As best viewed in FIG. 2C, the spring contact element 220 will react pressure applied in the z-axis at its tip (distal) end 224, as indicated by the arrow 232, such as would result from making a temporary pressure electrical connection with a terminal (not shown) of another electronic component (not shown). Compliance in the z-axis ensures that contact force (pressure) will be maintained, and also accommodates non-planarities (if any) between terminals (not shown) on the other electronic component (not shown). Such temporary electrical connections are useful for making temporary connections to the electronic component 202, such as for performing burn-in and/or testing of the component 202.

The tip (distal) end 224 is also free to move compliantly in the x- and y-directions, as indicated by the arrows 234 and 236, respectively. This would be important in the context of joining (by soldering, or brazing, or with a conductive adhesive) the tip end 224 to a terminal (not shown) of another electronic component (not shown) which has a different coefficient of thermal expansion than the substrate (component) 202. Such permanent electrical connections are useful for assemblies of electronic components, such as a plurality of memory chips (each of which is represented by the substrate 202) to another electronic component such as an interconnection substrate such as a printed circuit board ("PCB"; not shown).

By suitable choice of material and geometry, these plated-up structures 220 can function as free-standing resilient contact structures which have been fabricated with very precise dimensions and very precise spacings from one another. For example, tens of thousands of such spring contact elements (220) are readily precisely fabricated on a corresponding number of terminals on semiconductor devices which are resident on a semiconductor wafer (not shown).

In this manner, there has been shown a method of fabricating spring contact elements (220) directly on a substrate (202) such as an electronic component, such as a semiconductor device which may be resident on a semiconductor wafer, by applying at least one layer of masking material (104, 206, 208) on a surface of the substrate (202) and patterning the masking layer to have openings extending from areas (212) on the substrate to positions which are spaced above the surface of the substrate and which also are laterally and/or transversely offset from the areas 212); by optionally seeding (214) the openings; by depositing at least one layer of a conductive metallic material into the openings; and by removing the masking material so that the remaining conductive metallic material forms free-standing contact elements extending from the surface of the substrate, each contact element having a base end which is secured to a one of the areas of the substrate and having a tip end for making an electrical connection to a terminal of an electronic component. The plated-up structures 220 are principally, preferably entirely, metallic, and may be formed (fabricated) as multilayer structures. The spring contact element 220 shown in FIG. 2C is a plated-up structure which is elongate and has a base (proximal) end which is mounted to the electronic component device 202 and free (distal) end (tip) at its opposite end for making a pressure contact with a terminal (not shown) of another electronic component (not shown).

Suitable materials for the one or more layers of the contact structures include, but are not limited to:

nickel, and its alloys;

copper, cobalt, iron, and their alloys;

gold (especially hard gold) and silver, both of which exhibit excellent current-carrying capabilities and good contact resistivity characteristics;

elements of the platinum group;

noble metals;

semi-noble metals and their alloys, particularly elements of the palladium group and their alloys; and tungsten, molybdenum and other refractory metals and their alloys.

In cases where a solder-like finish is desired, tin, lead, bismuth, indium and their alloys can also be used.

The plated-up structures (120) are particularly well suited to making interconnections between microelectronic components and may have a height (z-axis) on the order of 4–40 mils, such as 5–12 mils and an overall length of 10–1000 mils such as 60–100 mils between their attached base ends and their free ends (tips).

Spring Contact Elements Effecting Space-Translation

Figure 3:
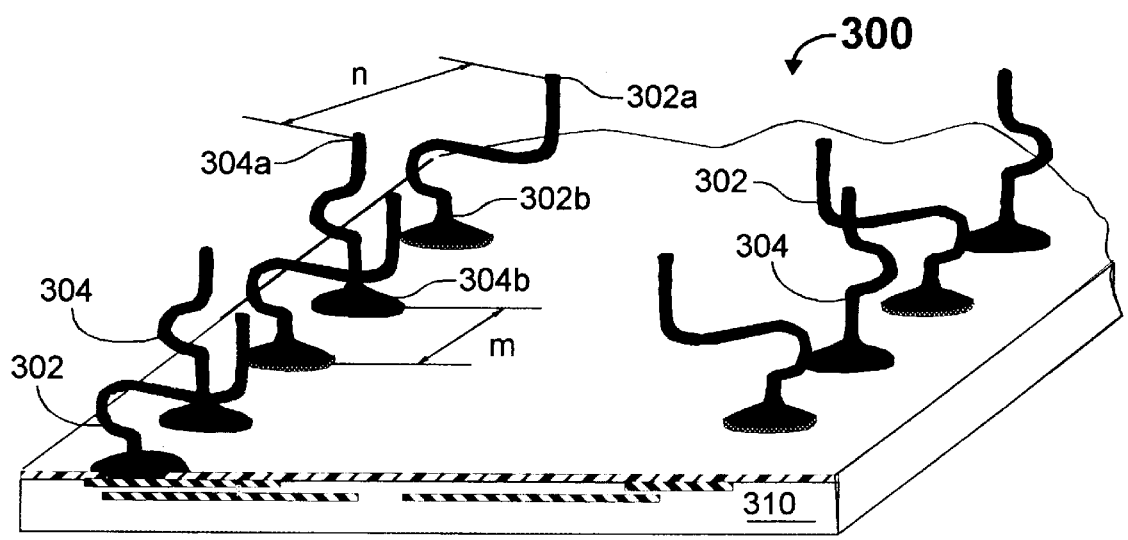
FIG. 3 is a perspective view of an electronic component having a plurality of spring contact elements mounted to terminals thereof.

FIG. 3, corresponding to FIG. 15A of the aforementioned PCT Patent Application No. US95/14909, discloses a technique 300 whereby individual ones 302, 304 of a plurality of spring contact elements (composite interconnection elements) disposed on an electronic component 310 can be sized and shaped so that their free ends (tips) 302a and 304a, respectively, are at a different pitch and orientation than their base ends 302b and 304b, respectively. In this manner, the spring contact elements themselves effect a type of space-translation which is pitch spreading. Evidently, performing space-translation in this manner requires that some of the spring contact elements be different (rather than identical) to others of the spring contact elements.

Routing Connections For The Spring Contact Elements

Figure 4:
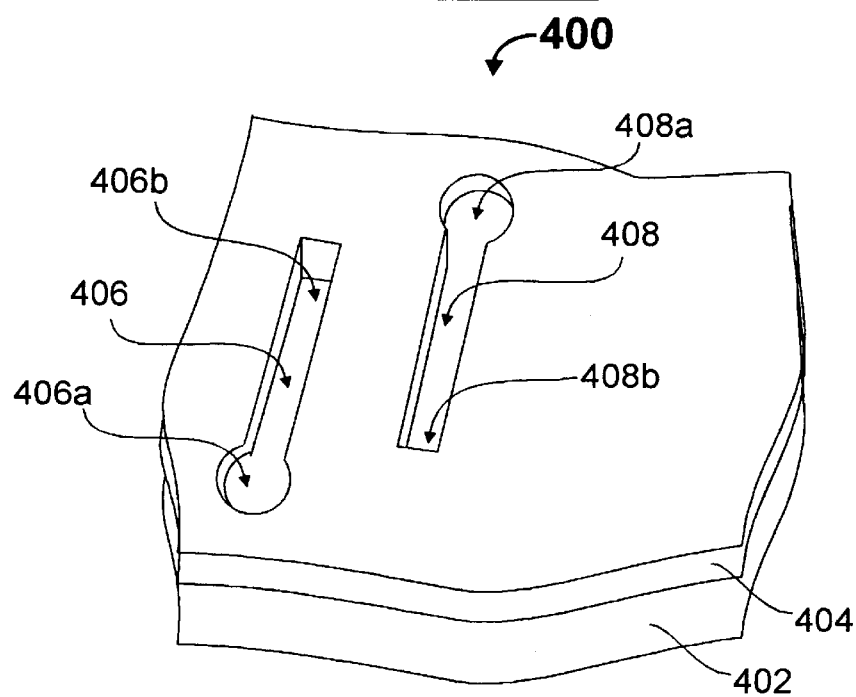
FIG. 4 is a perspective view of a technique for forming conductive lines on an existing electronic component.

FIG. 4 discloses a technique 400 for forming conductive lines on a surface of an electronic component 402 Compare FIG. 3D of the aforementioned PCT Patent Application No. US95/14885.

A masking layer 404 is applied onto the surface of the electronic component 402 and is patterned to have a plurality (two of many shown) of elongate openings 406 and 408, each elongate opening 406 and 408 having a one end 406a and 408a, respectively, directly over (proximal) a terminal (not shown) of the electronic component 402, each elongate opening 406 and 408 having an other end 406b and 408b, respectively) remote (distal) from the terminal of the electronic component 402.

In a manner comparable to the fabrication of the spring contact elements 220 described hereinabove, metallic material is deposited into the openings 406 and 408, and the masking layer 404 is stripped off of the electronic component 402, leaving behind a plurality of conductive lines extending from terminals of the electronic component to positions on the electronic component which are remote from the terminals.

In the aforementioned, commonly-owned PCT Patent Application No. US95/14885, this technique was described in the context of providing (routing) conductive traces between (interconnecting) two or more existing terminals on an existing electronic component (e.g., semiconductor device) 402, or for providing ground and/or power planes directly upon the electronic component 402, or for closely adjacent (e.g., interleaved) conductive lines which can serve as on-chip capacitors, or for uniformizing deposition of the metallic material onto other structures on the electronic component 402.

In the context of the present invention, the technique 400 is useful for relocating the base ends of spring contact elements so as to be remote from the existing terminals to which they are electrically connected. In other words, for forming "remote terminals" which are located elsewhere on the electronic component than the existing terminals.

Relocating The Spring Contact Elements ("Routing")

In applications where it is desired to fabricate a plurality of spring contact elements on an electronic component, whether the spring contact elements are of the composite interconnection (overcoated core element) type discussed with respect to FIGS. 1A–1C, or are of the plated-up type discussed with respect to FIGS. 2A–2C, there are benefits to be derived from having all of the spring contact elements be substantially the same as one another—namely, substantially of the same shape, size, height, etc. This provides for better process control, and more uniform mechanical and electrical behavior of the spring contact elements.

According to the present invention, a plurality of substantially identical spring contact elements can be fabricated upon an electronic component (e.g., a semiconductor device) having a particular layout of terminals (e.g., bond pads) in a manner that the free ends of the spring contact elements have a different layout than the bond pads. This is a form of space translation.

Figure 5A:
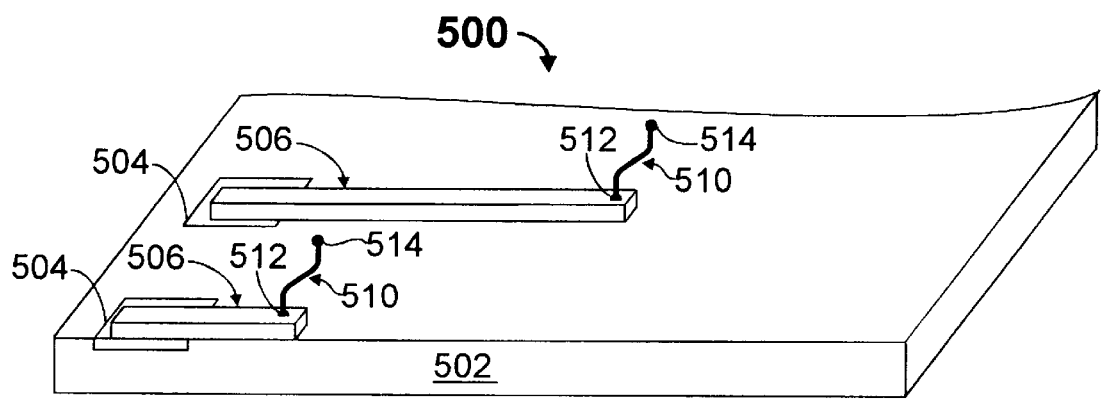
FIG. 5A is a perspective view of a technique for effecting space-translation with spring contact elements which are composite interconnection elements, according to the invention.

FIG. 5A illustrates a technique 500 for effecting space-translation with spring contact elements which are composite interconnection elements (compare 130).

An electronic component 502 such as a semiconductor device which may be a memory chip has a plurality (two of many shown) of terminals 504 on a surface thereof, according to conventional semiconductor fabrication techniques. The component 502 is complete, and may have a top passivation layer (not shown) with openings through which the terminals (bond pads) 502 can be accessed and connected to.

Prior to mounting, shaping and overcoating a wire stem in the manner described hereinabove with respect to FIGS. 1A–C, a plurality (two of many shown) of metal (conductive) lines 506 are formed on the surface of the component 502, each metal line extending from the terminal 504 along the surface of the device 502, to another location remote from the terminal 504. This metal line defines an "extended tail" for the resulting spring contact element 510 which is a composite interconnection element. At the remote position to which the extended tail 506 extends, in other words at the end of the extended tail which is distal from the terminal, the composite interconnection elements which are composite interconnection elements 510 are fabricated. Each spring contact element 510 has a base end 512, a free end (tip) 514, and a body portion between the base and free ends.

In the illustration of FIG. 5A, it can be seen that the two spring contact elements 510 which are composite interconnection elements are identical to one another, but that a one of the illustrated spring contact elements 510 has a longer extended tail 506 than the other of the illustrated spring contact elements 510.

Figure 5B:
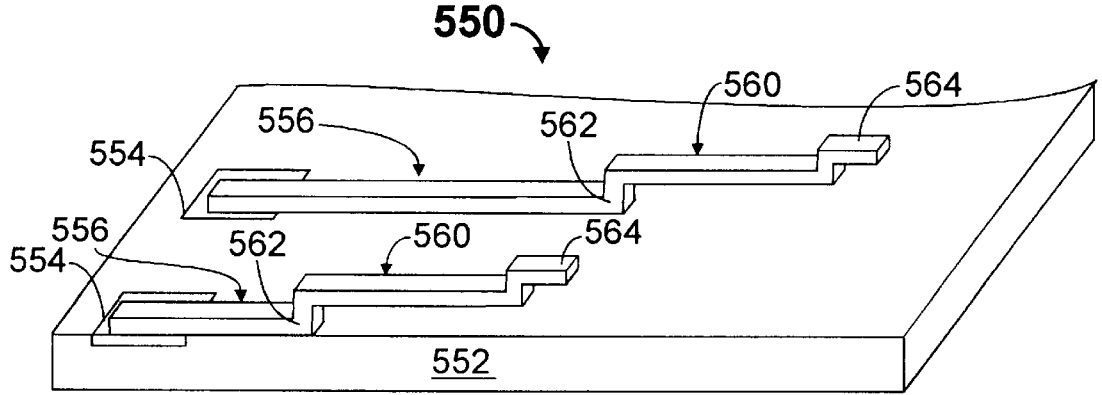
FIG. 5B is a perspective view of a technique for effecting space-translation with spring contact elements which are plated-up structures, according to the invention.

FIG. 5B illustrates a technique 550 for effecting space-translation with spring contact elements which are plated-up structures (compare 220).

An electronic component 552 (compare 502) such as a semiconductor device which may be a memory chip has a plurality (two of many shown) of terminals 554 (compare 504) on a surface thereof, according to conventional semiconductor fabrication techniques.

In conjunction with the patterning of multiple masking layers (see 204, 206, 208), seeding and depositing of metallic material described with respect to FIGS. 2A–2C, the opening whereat the base end of the resulting plated-up structure will be formed is elongated to extend from the terminal 554 (compare 212) of the device 552 (compare 202), along the surface of the device 552, to another location remote from the terminal. This elongate opening, when filled with metallic material, will define an extended tail 556 for the resulting plated-up structure 560. At the remote position to which the extended tail 556 extends, the masking layers are patterned to define the base end 562 of the resulting spring contact element 560. From this position (the base end), the masking layers are patterned to define the body portion and free end (tip) 564 of the resulting spring contact element 560.

In the illustration of FIG. 5B, it can be seen that the two spring contact elements which are plated-up structures 560 are identical to one another, but that a one of the illustrated spring contact elements 560 has a longer extended tail 556 than the other of the illustrated spring contact elements 560.

According to these techniques (500, 550), a plurality of spring contact elements (510, 560) which are substantially identical with one another can be formed at locations on an electronic component (502, 552) which are spatially-translated (positionally-removed) from the terminals (504, 554) of the electronic component (502, 552). It is within the scope of this invention that spring contact elements which are not substantially identical to one another can be disposed on conductive lines (510, 560), but such is generally not preferred.

As can be seen in FIGS. 5A and 5B, the terminals (504, 554) are disposed in a first pattern on the electronic component (502, 552) and that the distal ends (514, 564) of the spring contact elements (510, 560) are disposed in a second pattern which is different than the first pattern. The proximal ends (512, 562) of the spring contact elements (510, 560) are joined to ends of the conductive lines (506, 556) which are distal from the terminals (504, 554). Typically, the proximal ends (512, 562) of the spring contact elements (510, 560) are disposed in a pattern which is comparable to the second pattern of the distal ends (514, 564). In cases where the spring contact elements (510, 560) are absolutely identical to one another, the pattern of the proximal ends (512, 562) will be identical to the pattern of the distal ends (514, 564).

It is within the scope of this invention that the extended tails (506, 556) can comprise metallic depositions in two or more masking layers (see, e.g., FIG. 14A hereinbelow), and that they can cross over one another without shorting out (see, e.g., FIG. 14B hereinbelow) to effect complex routing schemes, utilizing conventional semiconductor metallization techniques.

An exemplary application of fabricating a plurality of identical spring contact elements on an electronic component (e.g., a semiconductor device) having a particular layout of terminals (e.g., bond pads) in a manner that the free ends (tips) of the spring contact elements have a different positional layout than the terminals of the component is shown in FIG. 4A of commonly-owned, copending U.S. patent application Ser. No. 08/863,511 filed May 27, 1997, which discloses offset stacking a plurality (two or more) of bare unpackaged semiconductor devices such as memory chips, each chip having a plurality of spring contact elements extending from an edge thereof, so that all of the spring contact elements of the stacked chips can individually make contact with corresponding terminals of an interconnection substrate.

An Application For Elongate Tails

Figure 6A:
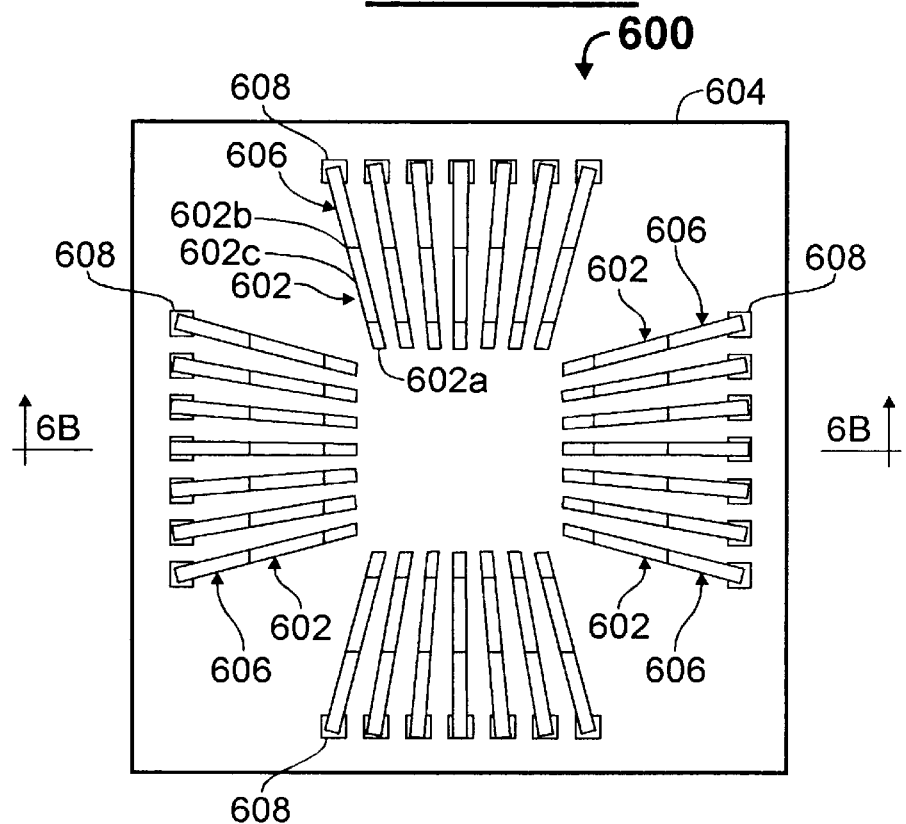
FIG. 6A is a schematic (stylized) plan view illustration of an application (use) for the spring contact elements having extended tails, according to the invention.
Figure 6B:
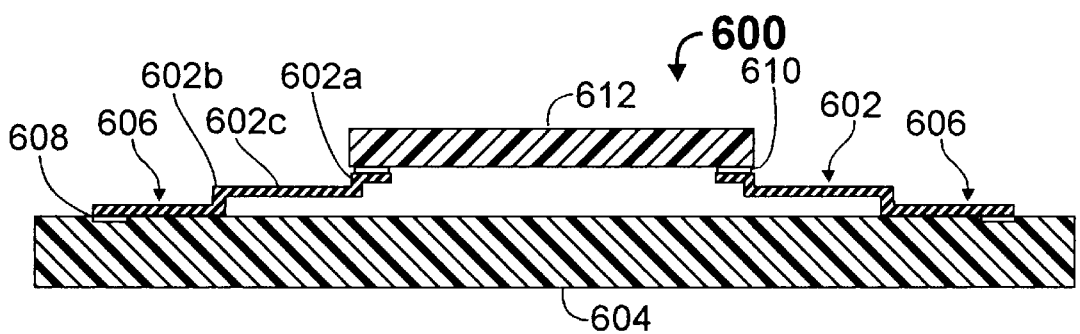
FIG. 6B is a cross-sectional view, taken on a line 6B—6B through FIG. 6A, according to the invention.

FIGS. 6A and 6B illustrate an exemplary application 600 for the spring contact elements having elongate tails of the present invention. Compare FIG. 5 of the aforementioned, PCT Patent Application No. US97/08271.

A plurality of spring contact elements 602 of the type described hereinabove with respect to FIG. 2 and 5B are arranged on the surface of a first electronic component 604 in a "fan-in pattern". Each spring contact element 602 has a "tail extension" 606 (compare 556) having a one (proximal) end joined to a terminal 608 of the first electronic component 604. The terminals 608 of the first electronic component 604 are disposed about a periphery of the first electronic component 604 at a first, relatively coarse pitch (spacing). The tail extensions (conductive lines) 606 extend generally radially inward from the terminals 604 towards the center of the first electronic component 604. The base ends 602b (compare 222) of the spring contact elements 602 are joined to the distal ends of the tail extensions 606. The main body portions 602c of the spring contact elements 602 extend generally radially inward from the tail extensions 606, partway to the center of the first electronic component 604. Thus, the tip ends 602a (compare 224) of the spring contact elements 602 are disposed in a peripheral pattern at a much closer spacing (finer pitch) than the terminals 608 of the first electronic component 604. In this manner, the tip ends 602a of the spring contact elements 602 can make contact with terminals 610 of a second electronic component 612 which are disposed at a much finer pitch than the terminals 608 of the first electronic component 604. As mentioned hereinabove, the tip ends 602a of the spring contact elements 602 may make either temporary (pressure) or permanent (soldered) connections with the terminals 610 of the second electronic component 612. This is best viewed in FIG. 6B.

Another Application For Elongate Tails

Figure 7A:
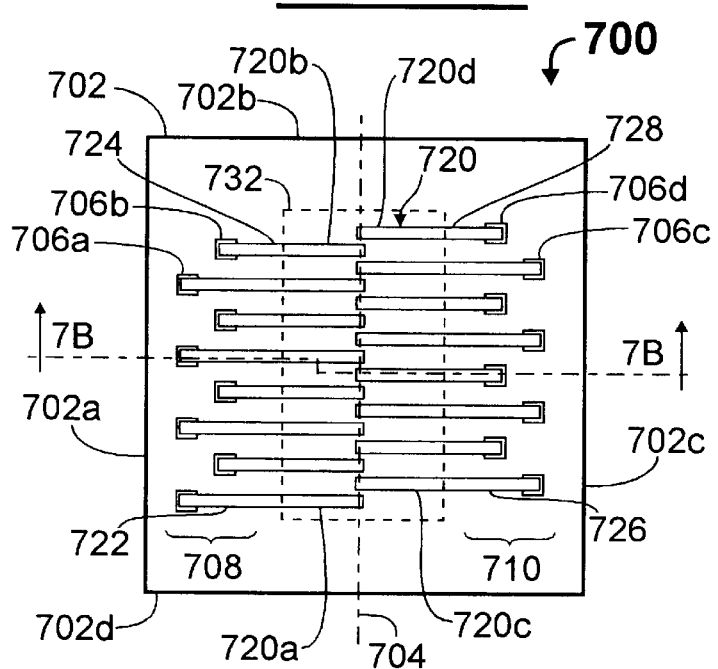
FIG. 7A is a schematic (stylized) plan view illustration of another application (use) for the spring contact elements having extended tails, according to the invention.
Figure 7B:
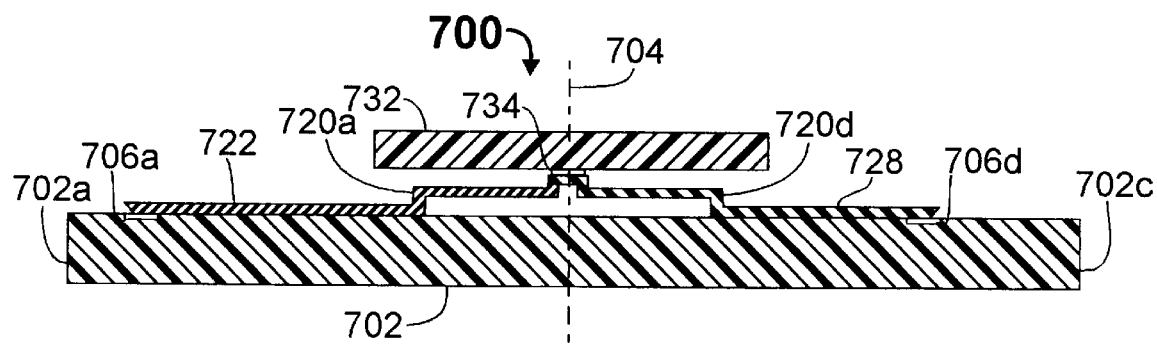
FIG. 7B is a cross-sectional view, taken on a line 7B—7B through FIG. 7A, according to the invention.

FIGS. 7A and 7B illustrate another exemplary application 700 for the spring contact elements having elongate tails of the present invention. Compare FIG. 6 of the aforementioned, PCT Patent Application No. US97/08271.

A plurality of spring contact elements of the type described hereinabove with respect to FIG. 2 and 5B are arranged on the surface of a first electronic component 702 in the following manner.

The first electronic component 702 has four side edges 702a, 702b, 702c and 702d, has a centerline 704, and has a plurality of terminals 706 disposed in opposing side areas 708 and 710 on its top surface.

In the side area 708, which is adjacent the side edge 702a, the terminals 706 are "staggered" so that a first portion 706a of the terminals 706 are disposed relatively close to the side edge 702a of the first electronic component 702, and a second portion 706b of the terminals 706 are disposed somewhat closer to the centerline 704 of (i.e., farther from the side edge 702a of) the first electronic component 702. As illustrated, the terminals 706a and 706b alternate between relatively close to the side edge 702a and farther from the side edge 702a.

In the side area 710, which is adjacent the side edge 702c, the terminals 706 are "staggered" so that a first portion 706c of the terminals 706 are disposed relatively close to the side edge 702c of the first electronic component 702, and a second portion 706d of the terminals 706 are disposed somewhat closer to the centerline 704 of (farther from the side edge 702c of) the first electronic component 702. As illustrated, the terminals 706c and 706d alternate between relatively close to the side edge 702c and farther from the side edge 702c.

A plurality of spring contact elements 720 (compare 220) are formed on the surface of the first electronic component 702 in the following manner. A first plurality of tail extensions 722 have their one (proximal) ends joined to the terminals 706a, and extend towards the centerline 704 of the first electronic component 702. A second plurality of tail extensions 724 have their one (proximal) ends joined to the terminals 706b, and extend towards the centerline 704 of the first electronic component 702. A third plurality of tail extensions 726 have their one (proximal) ends joined to the terminals 706c, and extend towards the centerline 704 of the first electronic component 702. A fourth plurality of tail extensions 728 have their one (proximal) ends joined to the terminals 706d, and extend towards the centerline 704 of the first electronic component 702. The tail extensions 722, 724, 726 and 728 are all parallel to one another, but they need not be.

A first portion 720a of the spring contact elements 720 are joined by their base ends to the distal ends of the first plurality of tail extensions 722, and their tip ends are disposed at the centerline 704 of the first electronic component 702.

A second portion 720b of the spring contact elements 720 are joined by their base ends to the distal ends of the second plurality of tail extensions 724, and their tip ends are disposed at the centerline 704 of the first electronic component 702.

A third portion 720c of the spring contact elements 720 are joined by their base ends to the distal ends of the third plurality of tail extensions 726, and their tip ends are disposed at the centerline 704 of the first electronic component 702.

A fourth portion 720d of the spring contact elements 720 are joined by their base ends to the distal ends of the fourth plurality of tail extensions 728, and their tip ends are disposed at the centerline 704 of the first electronic component 702.

In this manner, the spring contact elements 720 (720a, 720b, 720c, 720d) can be fabricated so as to be substantially identical to one another, yet have their tip (contact ends) arranged (laid out) entirely differently than the terminals 706a, 706b, 706c and 706d, respectively, to which they are electrically connected via the conductive lines (elongate tails) 722, 724, 726 and 728, respectively.

In use, the first electronic component 702 makes electrical connections to a second electronic component 732, the tip (contact) ends of the spring contact elements contacting corresponding terminals 734 on the second electronic component 732. This is best viewed in FIG. 7B.

The showing of only a limited variety of different-length conductive lines is merely exemplary and it should be understood that it is within the scope of this invention that a plurality of conductive lines having a greater number of variations (e.g., differences in length, as well as in their path along the surface of the electronic component) can be disposed on an electronic component to effect numerous space-translation schemes.

Relocating The Bases Of Two Or More Springs Which Are Connected To A Single Terminal Of The Electronic Component In certain instances, it may be desireable not only to relocate the base of a single spring contact element, but to have two or more "relocated" spring contact elements connected to a single terminal of the electronic component.

Figure 8A:
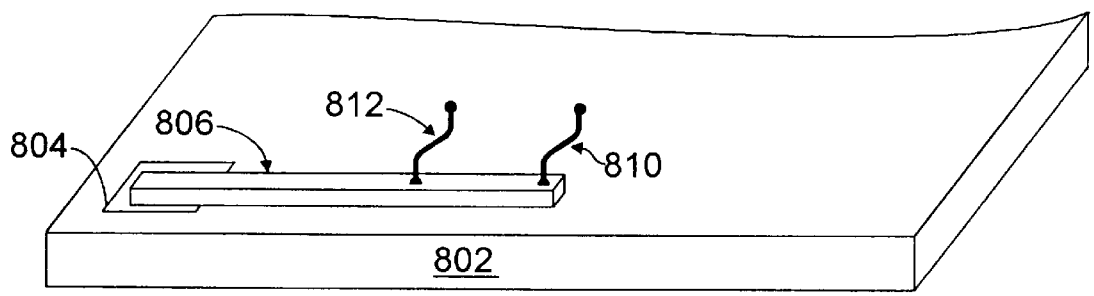
FIG. 8A is a perspective view of two spring contact elements which are "composite interconnection elements" mounted to distal regions of a conductive line emanating from a terminal of an electronic component, according to the invention.

FIG. 8A illustrates an embodiment 800 of the invention. An electronic component 802 has a terminal 804. An elongate conductive line (tail) 806 is formed on the electronic component 802 with its proximal end joined to the terminal 804. A one spring contact element 810 is joined by its base to the distal end of the elongate conductive line 806. Another spring contact element 812 is joined by its base to the conductive line 806 at a position on the conductive line 806 which is remote from the proximal end of the conductive line 806, yet which is not at the distal end of the conductive line 806. The two spring contact elements 810 and 812 are of the composite interconnection type (compare 130), and are preferably identical to one another.

Figure 8B:
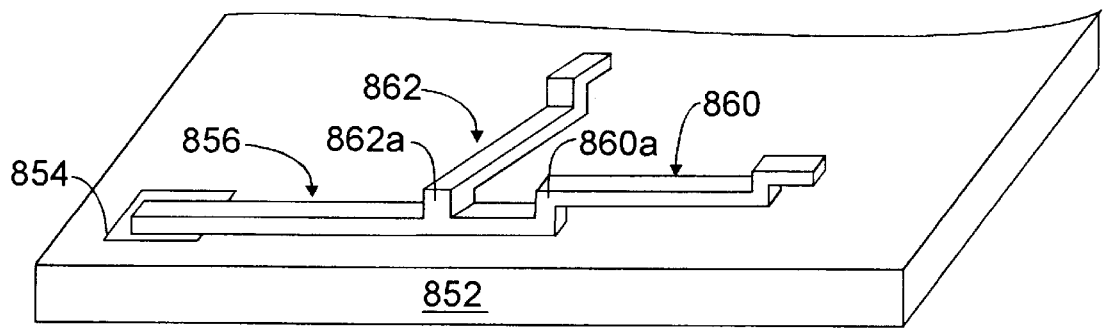
FIG. 8B is a perspective view of two spring contact elements which are "plated-up structures" mounted to distal regions of a conductive line emanating from a terminal of an electronic component, according to the invention.

FIG. 8B illustrates another embodiment 850 of the invention. An electronic component 852 (compare 802) has a terminal 854 (compare 804). An elongate conductive line 856 (compare 806) is formed on the electronic component 852 with its proximal end joined to the terminal 854. A one spring contact element 860 (compare 810) is joined by its base 860a (compare 222) to the distal end of the elongate conductive line 856. Another spring contact element 862 (compare 812) is joined by its base 862a (compare 222) to the conductive line 856 at a position on the conductive line 856 which is remote from the proximal end of the conductive line 856, yet which is not at the distal end of the conductive line 856. The two spring contact elements 860 and 862 are of the plated-up structure type, and are preferably identical to one another.

Relocating Terminals Of An Electronic Component

The elongate tails (conductive lines) described hereinabove permit spring contact elements to be located other than at the positions of existing terminals of an existing electronic component. For example, a semiconductor device may have a plurality of bond pad terminals located about its periphery, outside of a central area which contains active circuitry. The present invention makes it possible to mount spring contact elements directly above (atop) the active components of the semiconductor device.

Figure 9:
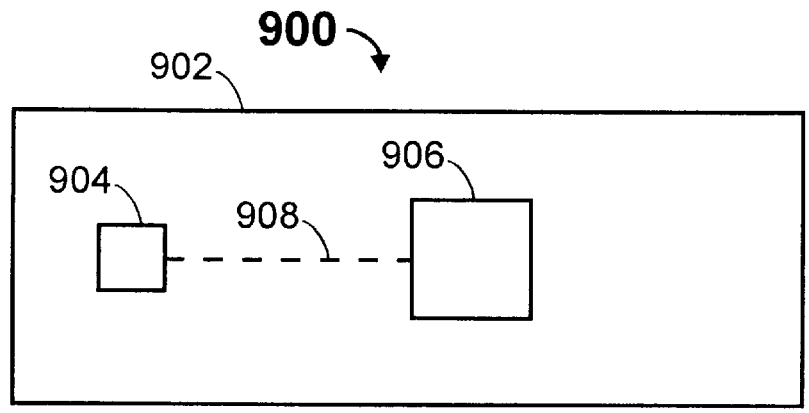
FIG. 9 is a schematic plan view of an existing terminal of an electronic component, a "relocated terminal" and a connection therebetween, according to the invention.

An example is shown schematically in FIG. 9, wherein an electronic component 902 has an existing terminal 904 at a first position. It is desired to fabricate or to mount a spring contact element (not shown) at a position on the electronic component 904 which is remote from the terminal 904, for example directly over active circuitry on the electronic component 902. To this end, a "relocated terminal" 906 is fabricated at a position which is remote from the terminal 904 and is electrically connected, as shown by the dashed line 908 to the terminal 904. A spring contact element (not shown) of any of the types described hereinabove can then have its base end secured to the relocated terminal 906.

Generally, the "relocated terminal" 906 is simply the distal end of a conductive line of the type described hereinabove, including any position on the conductive line which is remote from the proximal end of the conductive line. FIG. 9 illustrates that the distal end of the conductive line can be formed to have a large surface area. Various techniques of effecting the electrical connection between the terminal 904 and the relocated terminal 906 are now described.

Filling Openings In A Masking Layer With Conductive Material

Figure 9A:
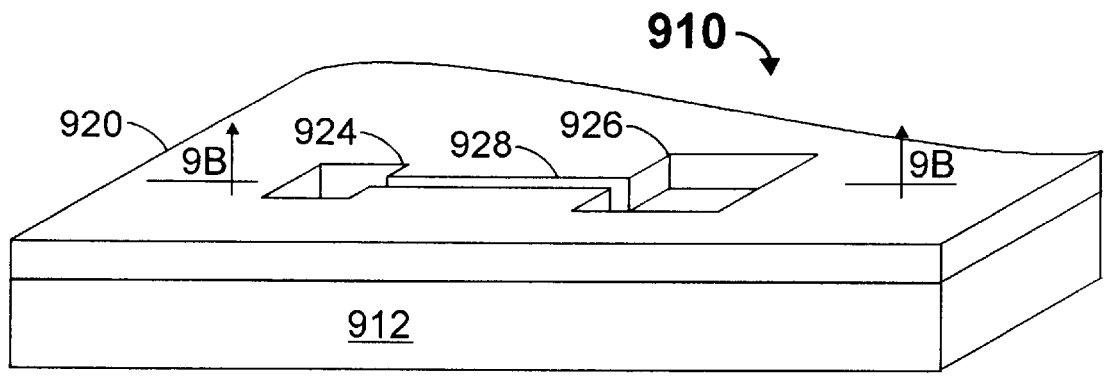
FIG. 9A is a perspective view of a technique for forming a relocated terminal on an electronic component, and effecting an electrical connection to an existing terminal of the component, according to the invention.
Figure 9B:
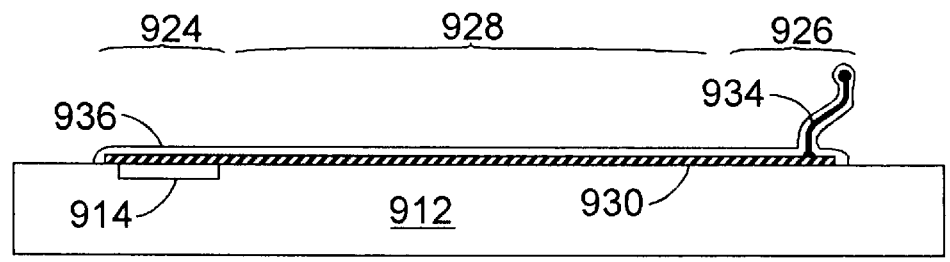
FIG. 9B is a cross-sectional view, taken on a line 9B—9B through FIG. 9A, according to the invention.

FIGS. 9A and 9B illustrates a technique 910 for fabricating a relocated terminal and for effecting an electrical connection between the relocated terminal and an existing terminal of an electronic component 912 (compare 902). A masking layer 920 is applied over the surface of the electronic component 912 and is patterned to have a first portion 924 of an opening directly over the existing terminal 914 (compare 904) of the electronic component 912, a second portion 926 of the opening at a position remote from the existing terminal (compare 906), and an elongate opening 928 (compare 908) extending between the first and second openings 924 and 926, respectively. The openings 924, 926 and 928 are contiguous with one another, and are filled with conductive material 930. A portion of the conductive material 930 fills the opening 924 which is directly atop the existing terminal, and is joined thereto. This will become the proximal end of the conductive line (elongate tail). The conductive material 930 also fills the opening 926 and becomes the relocated terminal (compare 906). The conductive material 930 also fills the opening 928 and becomes an elongate conductive line (compare 908) joining (electrically connecting) the conductive material in the opening 924 to the conductive material in the opening 926. The technique 910 illustrated in FIG. 9A is comparable to the technique 400 described with respect to FIG. 4. In both, openings in a masking layer are created and filled with conductive (metallic) material.

As shown in FIG. 9B, the conductive material 930 deposited in the openings 924, 926 and 928 can be very thin, and may simply be a "seed layer" to support subsequent plating. A core element 934 (compare 102) can be joined to the seed layer 930 at a position within the opening 926. Then, both the core element 934 and the seed layer 930 can be overcoated with a conductive material 936 (compare 134).

An Alternate Technique ("Spot Gold")

Figure 10:
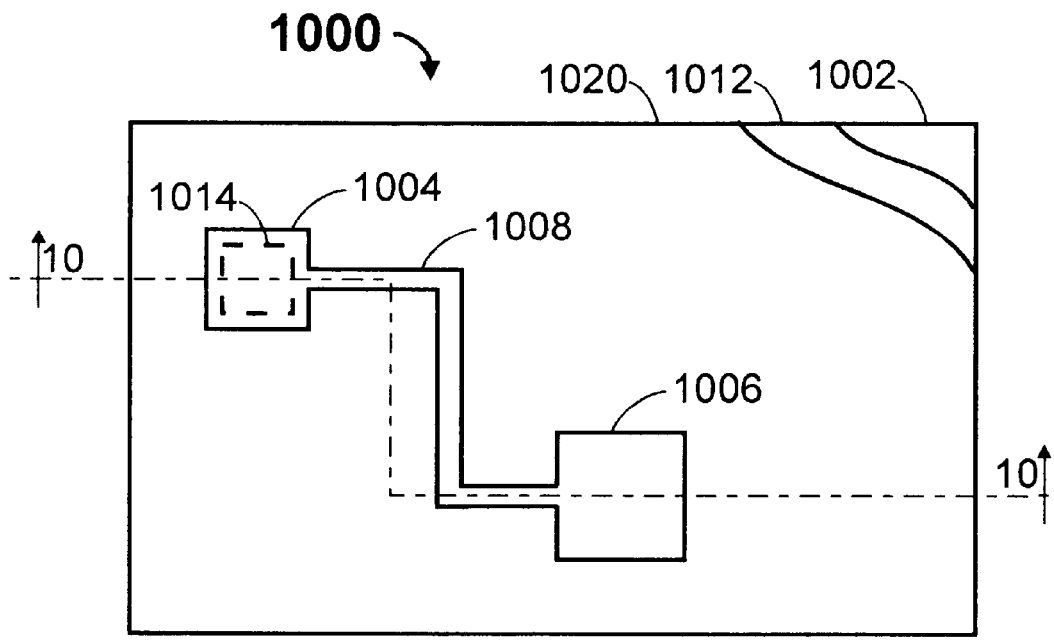
FIG. 10 is a schematic plan view of a first step of mounting or fabricating spring contact elements to relocated terminals on an electronic component, according to the invention.

FIG. 10 illustrates a first (preliminary) step 1000 in another of two similar techniques for fabricating a relocated terminal and for effecting an electrical connection between the relocated terminal and an existing terminal of an electronic component. A first of these techniques is described with respect to FIGS. 10A–10C. A second of these techniques is described with respect to FIGS. 10D–10G. In both techniques, gold is applied and patterned ("spot gold").

Figure 10A:
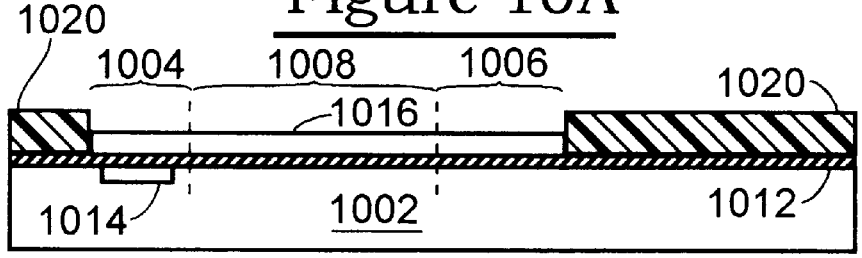
FIGS. 10A–10C are side-cross sectional views, taken on a line 10—10 through FIG. 10 of an embodiment of a technique for mounting or fabricating spring contact elements to relocated terminals on an electronic component, according to the invention.
Figure 10B:
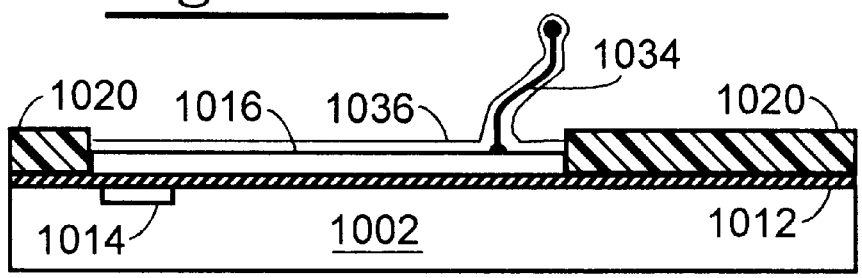
Figure 10C:
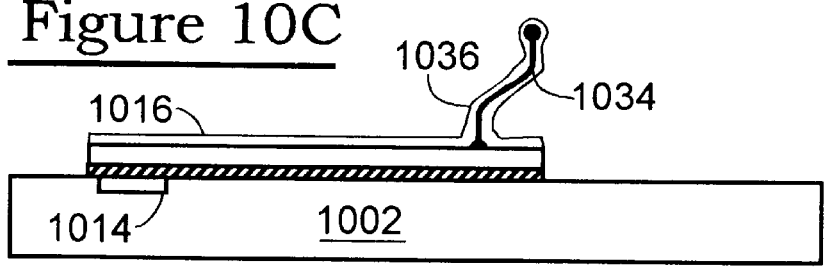

In the technique illustrated in FIGS. 10A–10C (including the preliminary step shown in FIG. 10), a layer 1012 of titanium-tungsten (TiW) is applied onto the surface of an electronic component 1002. This layer 1012 is suitably a blanket layer, covering the entire surface of the electronic component 1002, and suitable has a thickness of approximately 4500 Å (Angstroms).

Then, a masking layer 1020 (compare 920) such as photoresist is applied over the layer 1012 and is patterned to have an opening with portions 1004 (compare 904, 924), 1006 (compare 906, 926) and 1008 (compare 908, 928). The portion 1004 of the opening is directly over an existing terminal 1014 (compare 914) of the electronic component 1002. The portion 1006 is remote from the location of the terminal 1014. The portion 1008 extends between the portions 1004 and 1006.

Next, as best viewed in FIG. 10A, a layer 1016 of gold is applied within the opening. This layer 1016 is applied in any suitable manner and suitably has a thickness of approximately 1200 Å. The patterned layer 1016, and the portion of the layer 1012 which lies immediately underneath the patterned layer 1016 comprise the conductive line which "relocates" the terminal for remote attachment of the spring contact element.

Next, as best viewed in FIG. 10B, a core element 1034 (compare 934) is attached to the layer 1016 at a position remote from the terminal 1014, such as within the portion 1006 of opening in the masking layer 1020. Then, the core element 1034 and the patterned layer 1016 is overcoated with a layer 1036 (compare 936) of a metallic material in the manner described hereinabove with respect to the composite interconnection element 130.

As is evident, the first metallic layer 1012 will electrically connect all of a plurality of openings in the masking layer to one another, consequently all of the spot gold patterns (1016) to one another, consequently all of the core elements 1034 to one another. In this respect, the layer 1012 serves as a "shorting layer" to facilitate the application both of the spot gold 1016 and of the overcoat material 1036 by electroplating techniques. The final overcoat material 1036 is suitably nickel or an alloy thereof.

As best viewed in FIG. 10C, in a final step of this first technique, the masking layer 1020 is removed, and the portions of the shorting layer 1012 which were covered by the masking layer 1020 exposed. By selective chemical etching, these portions of the shorting layer 1012 which were not spot-gold coated may readily be removed, thereby electrically isolating a one spring contact element from other spring contact elements (not shown) in the plurality of spring contact elements which have been mounted to the electronic component 1002.

In the technique illustrated in FIGS. 10C–10G (including the preliminary step shown in FIG. 10), a layer 1012 of titanium-tungsten (TiW) is applied onto the surface of an electronic component 1002. This layer 1012 is suitably a blanket layer, covering the entire surface of the electronic component 1002, and suitable has a thickness of approximately 4500 Å (Angstroms).

Then, a masking layer 1020 (compare 920) such as photoresist is applied over the layer 1012 and is patterned to have an opening with portions 1004 (compare 904, 924), 1006 (compare 906, 926) and 1008 (compare 908, 928). The portion 1004 of the opening is directly over an existing terminal 1014 (compare 914) of the electronic component 1002. The portion 1006 is remote from the location of the terminal 1014. The portion 1008 extends between the portions 1004 and 1006.

Next, a layer 1016 of gold is applied within the opening. This layer 1016 is applied in any suitable manner and suitably has a thickness of approximately 1200 Å. The patterned layer 1016, and the portion of the layer 1012 which lies immediately underneath the patterned layer 1016 comprise the conductive line which "relocates" the terminal for remote attachment of the spring contact element.

Figure 10D:
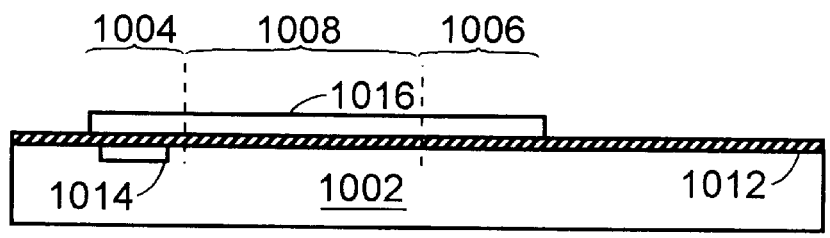
FIGS. 10D–10G are side-cross sectional views, taken on a line 10—10 through FIG. 10 of another embodiment of a technique for mounting or fabricating spring contact elements to relocated terminals on an electronic component, according to the invention.

Up to this point, the second technique is quite similar to the first technique described with respect to FIGS. 10A–10C Next, as best viewed in FIG. 10D, the masking layer 1020 is removed, resulting in a plurality of spot gold patterns (lines) atop the first conductive layer 1012.

Figure 10E:
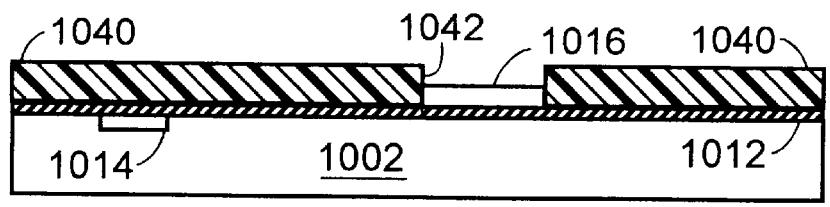

Next, as best viewed in FIG. 10E, a second masking layer 1040 (compare 1020) is applied and patterned so as to cover all but a portion of the spot gold layer 1016 which is remote from the terminal 1014 at a position corresponding to the portion 1006 of the opening in the earlier masking layer 1020 which has been removed. In other words, the masking layer 1040 has an opening 1042 at the same "remote terminal" position as the portion 1006 of previous masking layer 1020.

Figure 10F:
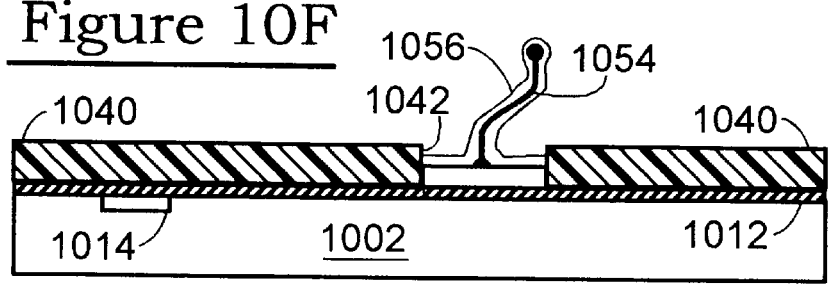

Next, as best viewed in FIG. 10F, a core element 1054 (compare 1034) is attached to the layer 1016 within the opening 1042. Then, the core element 1054 and the portion of the patterned layer 1016 which is exposed within the opening 1042 is overcoated with a layer 1056 (compare 1036) of a metallic material in the manner described hereinabove with respect to the composite interconnection element 130.

As with the previously-described technique, the first metallic layer 1012 will electrically connect all of a plurality of openings (1042) in the masking layer (1040) to one another, consequently all of the spot gold patterns (1016) to one another, consequently all of the core elements 1054 to one another, the first metallic layer 1012 serving as a "shorting layer" to facilitate electroplating.

Figure 10G:
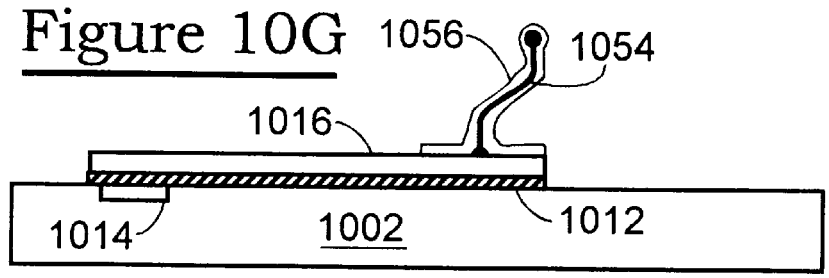

As best viewed in FIG. 10G, in a final step of this second technique, the masking layer 1040 is removed, leaving portions of the shorting layer 1012 which were not spot-gold coated completely exposed. By selective chemical etching, these portions of the shorting layer 1012 may readily be removed, thereby electrically isolating a one spring contact element from other spring contact elements (not shown) in the plurality of spring contact elements which have been mounted to the electronic component 1002.

Mounting Pre-Fabricated Spring Contact Elements To Conductors

There have been discussed, hereinabove, a number of techniques for fabricating spring contact elements (such as composite interconnection elements) at remote positions on conductors which may be conductive lines (extended tails) extending from terminals of an electronic component, as well for fabricating extended tails extending from bases of spring contact element in one fell swoop. There are now described techniques for prefabricating spring contact elements, and joining the prefabricated spring contact elements to remote positions (e.g., distal ends) of conductive lines extending from existing terminals of an electronic component.

Figure 11A:
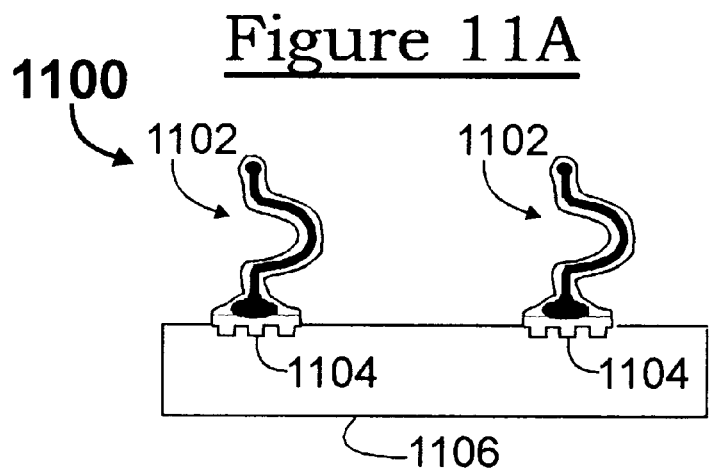
FIGS. 11A–11C are cross-sectional views of a technique for mounting previously manufactured spring contact elements which are composite interconnection elements to conductive lines on an electronic component, according to the invention.
Figure 11B:
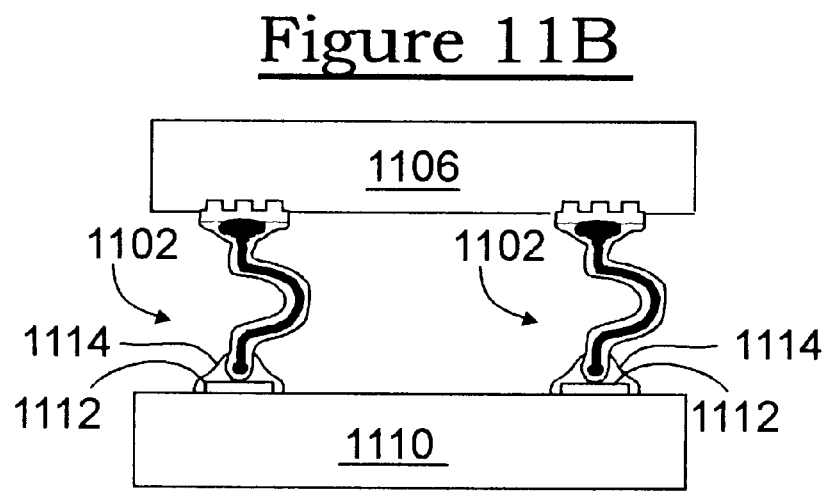

FIGS. 11A–11B are comparable to FIGS. 5C and 5F of commonly-owned, copending U.S. patent application Ser. No. 08/788,740 filed Jan 24, 1997 (status: pending) and its counterpart PCT Patent Application No. US96/08107 filed May 24, 1996 (Published Nov. 28, 1996 as WO96/37332) and illustrate how a plurality of composite interconnection elements can be prefabricated on a sacrificial substrate, then "gang-transferred" to terminals of an electronic component. For purposes of the present invention, the prefabricated spring contact elements are gang-transferred to remote positions on conductive lines (extended tails).

FIG. 11A shows a technique 1100 whereby a plurality (two of many shown) of composite interconnection elements 1102 which have been fabricated, including overcoated, on contact tip structures 1104 which have been formed in a sacrificial substrate 1106 such as aluminum or silicon.

FIG. 11B shows the sacrificial substrate 1106, with composite interconnection elements 1102 (compare 510 hereinabove) extending therefrom, positioned above an electronic component 1110 (compare 502 hereinabove) so that the free ends of the composite interconnection elements 1102 are adjacent conductive lines 1112 (viewed endwise, compare 506 hereinabove) which are resident on the electronic component 1110. The free ends of the composite interconnection elements 1102 are then joined (such as by soldering or brazing, or with a conductive adhesive) with a joining material 1114 to the conductive lines 1112.

Next, as shown in FIG. 1C, the sacrificial substrate 1106 is removed, such as with heat or by chemical etching. In this manner, the gang (en masse) transfer of a plurality of composite interconnection elements 1102 is effected to a corresponding plurality of conductive lines 1114 on an electronic component. It is within the scope of this invention that the spring contact elements 1102 are or are not provided with the illustrated prefabricated contact tip structures 1104.

Figure 11C:
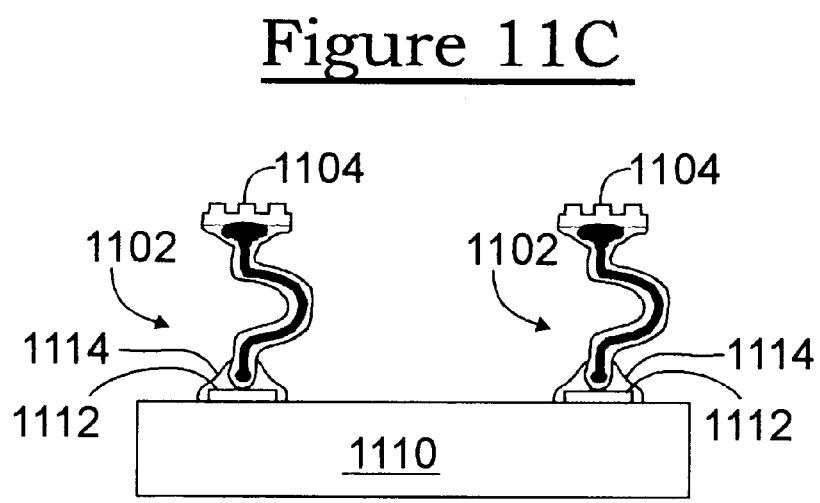

FIGS. 11A–11C, described hereinabove, are illustrative of joining a plurality of prefabricated spring contact elements of the composite interconnection type to a corresponding plurality of conductive lines extending from terminals on an electronic component. In a similar manner, a plurality of prefabricated spring contact elements of the plated-up structure type can be joined to a plurality of conductive lines extending from terminals on an electronic component.

Figure 12A:
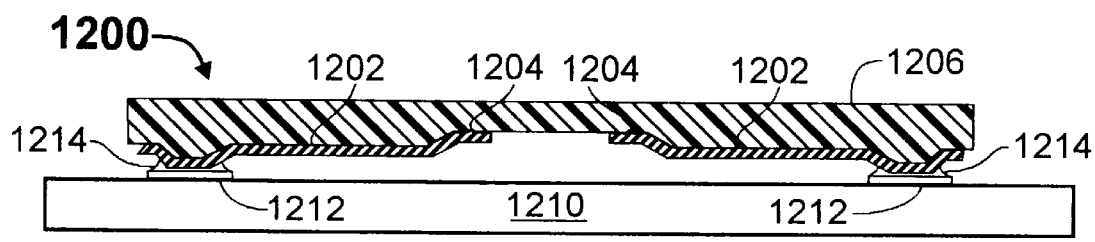
FIGS. 12A–12C are cross-sectional views of a technique for mounting previously manufactured spring contact elements which are plated-up structures to conductive lines on an electronic component, according to the invention.
Figure 12B:
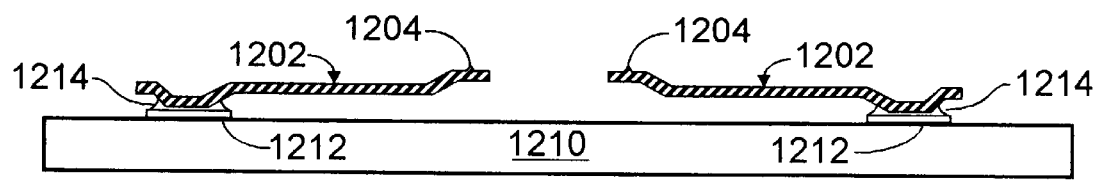
Figure 12C:
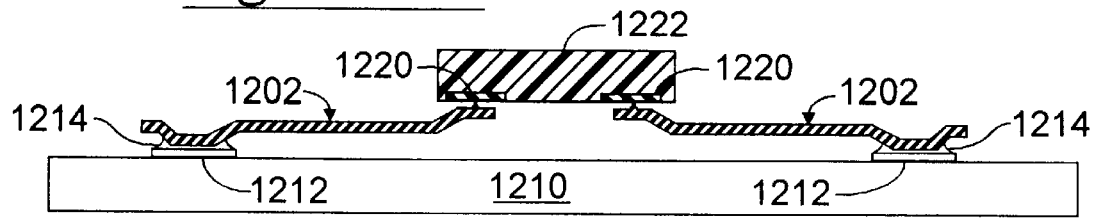

FIGS. 12A–12C are comparable to FIGS. 4A–4C of the aforementioned U.S. Ser. No. 08/802,054 and PCT US97/08271, and illustrate how a plurality of plated-up type spring contact elements can be prefabricated on a sacrificial substrate, then "gang-transferred" to terminals of an electronic component. For purposes of the present invention, the prefabricated spring contact elements are gang-transferred to remote positions on conductive lines (extended tails).

FIG. 12A shows a technique 1200 whereby a plurality (two of many shown) of plated-up spring contact elements 1202 (compare 1102) which have been fabricated on a sacrificial substrate 1206 (compare 1106) such as a silicon wafer, by repeated masking, etching and deposition of metallic materials. The spring contact elements 1202 have pointy contact features 1204 (compare 1104) at their contact ends which are suitably in the form of truncated pyramids.

FIG. 12B shows the sacrificial substrate 1206, with plated-up spring contact elements 1202 disposed on a surface thereof positioned above an electronic component 1210 (compare 1110) so that the contact tip features 1204 are adjacent conductive lines 1212 (compare 1112) which are resident on the electronic component 1210. The tip ends of the plated-up spring contact elements 1202 are then joined (such as by soldering or brazing, or with a conductive adhesive) with a joining material 1214 (compare 1114) to the conductive lines 1212.

Next, as shown in FIG. 12C, the sacrificial substrate 1206 is removed, such as with heat or by chemical etching. In this manner, the gang (en masse) transfer of a plurality of spring contact elements 1202 is effected to a corresponding plurality of conductive lines 1212 on an electronic component. It should be understood that for permanently joining the spring contact elements 1202 to the conductive lines 1212 that the contact features 1204 are somewhat superfluous, their primary purpose being to effect reliable pressure connections to terminals of other electronic components. However, during joining the spring contact elements 1202 to the conductive lines 1212, these pointy features 1204 may help keep the components in place during reflow soldering (e.g.). FIG. 12C illustrates the free ends of the spring contact elements 1202 making contact with terminals 1220 of another electronic component 1222.

Joining Contact Tip Structures To The Spring Contact Elements

The subject of providing spring contact elements with contact tip structures which have been fabricated to have a distinct metallurgy and shape has been described in a number of the aforementioned patent applications.

Figure 13A:
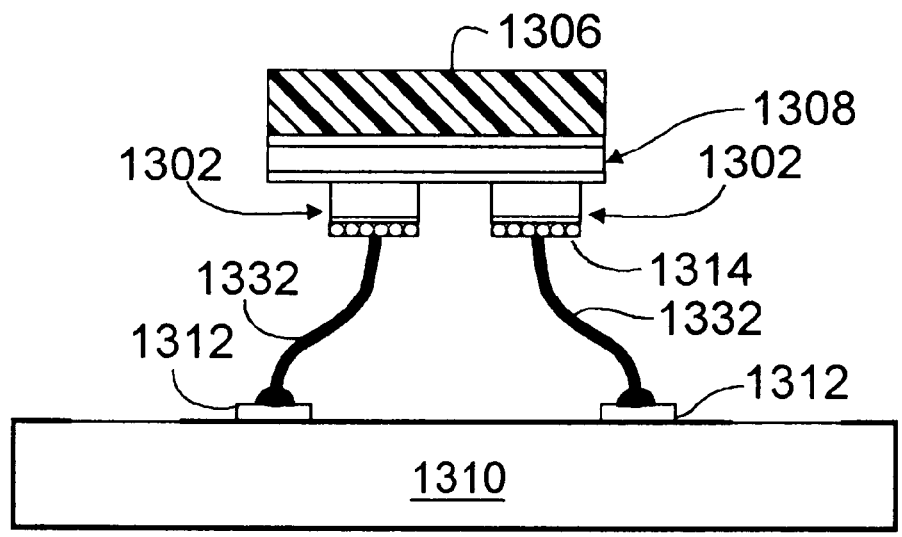
FIGS. 13A and 13B are cross-sectional views of a technique for mounting previously manufactured contact tip structures to spring contact elements which are resident on conductive lines (extended tails), according to the invention.
Figure 13B:
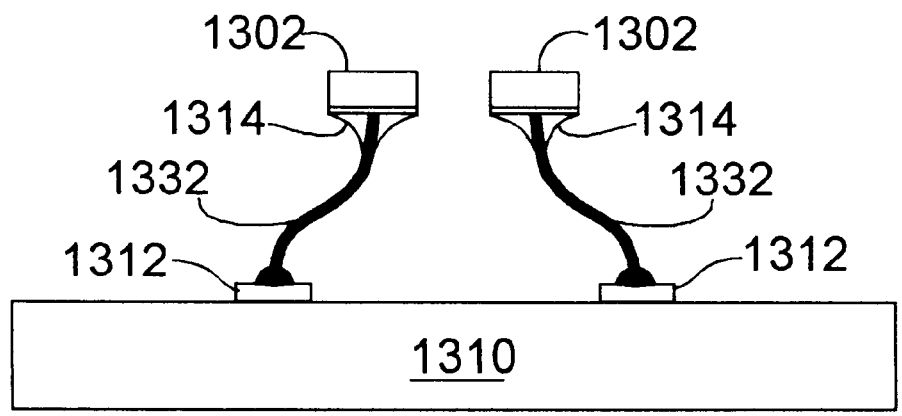

FIGS. 13A and 13B are comparable to FIGS. 6D and 6E of the aforementioned U.S. Ser. No. 08/788,740 and PCT US96/08107 and illustrate how a plurality of contact tip structures can be prefabricated on a sacrificial substrate, then "gangtransferred" to ends of spring contact elements which are resident on an electronic component. This is somewhat akin in nature to the previously-described techniques for gang transferring prefabricated spring contact elements to remote positions on conductive lines (extended tails).

FIG. 13A shows a technique 1200 whereby a plurality (two of many shown) of prefabricated contact tip structures 1302 (compare 1202) have been fabricated on a sacrificial substrate 1306 (compare 1206) such as a silicon wafer, by masking, etching and deposition of metallic materials. A release mechanism 1308 comprising one or more layers is disposed between the contact tip structures 1302 and the sacrificial substrate 1306.

The sacrificial substrate 1306, with contact tip structures 1302 disposed on a surface thereof is positioned above an electronic component 1310 (compare 1210) so that the contact tip structures 1302 are against free ends of spring contact elements 1332 extending from remote regions of conductive lines 1312 (compare 1212) on the electronic component 1310. The contact tip structures 1302 are then joined (such as by soldering or brazing, or with a conductive adhesive) with a joining material 1314 (compare 1214) to the spring contact elements 1332.

Next, as shown in FIG. 13B, the sacrificial substrate 1306 is removed, such as with heat or by chemical etching. In this manner, the gang (en masse) transfer of a plurality of contact tip structures 1302 is effected to a corresponding plurality of spring contact elements 1332 which are disposed on conductive lines 1312 on an electronic component 1310.

Multi-Level Conductive Lines

Figure 14A:
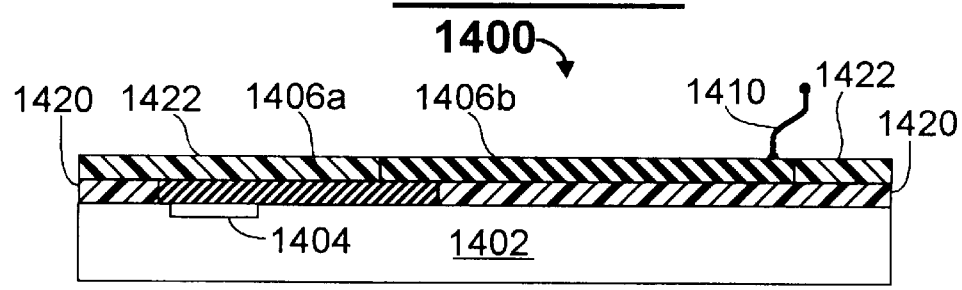
FIG. 14A is a cross-sectional view of a technique for making multi-level conductive lines on an electronic component, according to the invention.

FIG. 14A illustrates a technique 1400 whereby a conductive line, such as those described hereinabove, is disposed in two distinct layers atop the electronic component 1402 (compare 502). The electronic component 1402 has a terminal 1404 (compare 504). A first portion 1406a of the conductive line has a first end directly atop the terminal 1404, and has a second opposite end. The first portion 1406a of the conductive line is in a first layer, surrounded by an insulating material 1420. A second portion 1406b of the conductive line is in a second layer, atop the first layer, is surrounded by an insulating material 1422, has a first end overlapping the second end of the first portion 1406a, and has a second opposite end remote from the terminal 1404. A spring contact element 1410 (compare 510) is mounted to a remote (from the terminal 1404) portion of the second portion 506b of the conductive line. The concept illustrated here can be extended to fabricate conductive lines having portions in more than two layers.

Crossing Over

Figure 14B:
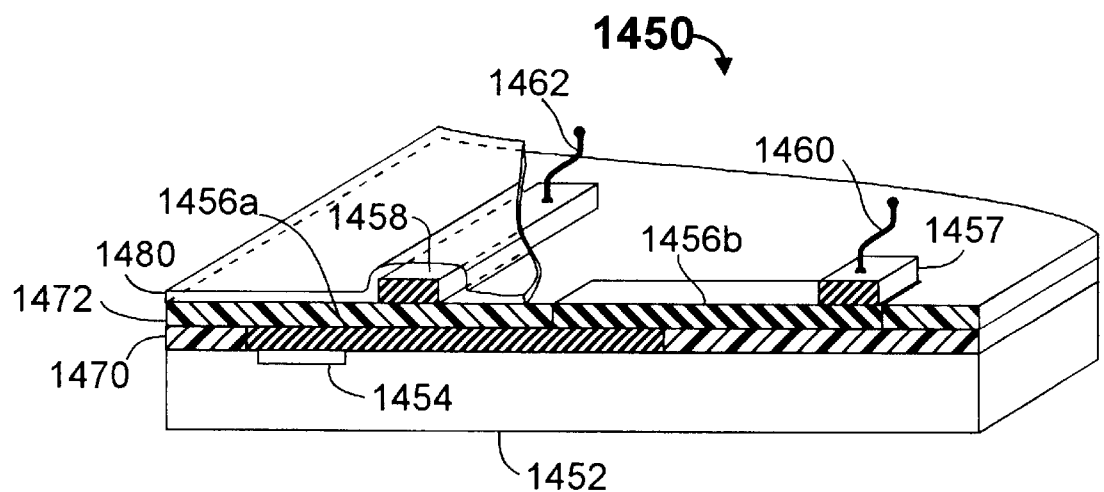
FIG. 14B is a perspective view, partially broken away, of a technique for making conductive lines which cross over one another on an electronic component, according to the invention.

FIG. 14B illustrates a technique 1450 whereby at least one of a plurality of conductive lines, such as those described hereinabove, is disposed in multiple distinct layers atop the electronic component 1452 (compare 1402). The electronic component 1452 has a terminal 1454 (compare 1404). A first portion 556a (compare 506a) of a first conductive line has a first end directly atop the terminal 1454, and has a second opposite end. The first portion 1456a of the first conductive line is in a first layer, surrounded by an insulating material 1470 (compare 1420). A second portion 556b (compare 506b) of the first conductive line is in a second layer, atop the first layer, is surrounded by an insulating material 1472 (compare 1422), has a first end overlapping the second end of the first portion 1456a, and has a second opposite end remote from the terminal 1404. In this example, a conductive spacer block 1457 is disposed mounted to a remote (from the terminal 1404) portion of the second portion 1456b of the first conductive line, and a spring contact element 1460 (compare 1410) is mounted to the conductive spacer block 1457. The spacer block 1457 is in a third layer wherein, as will be seen, there is a second conductive line having a portion 1458 crossing over a portion 1456a of the first conductive line.

A second conductive line originates from another terminal (not shown) on the electronic component 1452. In a manner similar to that of the first conductive line having portions in various ones of multiple layers, the second conductive line also has portions (one, 1458, shown) in various ones of multiple layers. As illustrated, a portion 1458 of the second conductive line crosses over the portion 1456a of the first conductive line, and a spring contact element 1462 (compare 1460) is mounted to the portion 1462 of the second conductive line at a position which is remote from the terminal. In this manner, complex routing schemes can be effected. A final passivation (protective) layer 1480 of encapsulating material may be applied over the conductive lines.

Although the invention has been illustrated and described in detail in the drawings and foregoing description, the same is to be considered as illustrative and not restrictive in character—it being understood that only preferred embodiments have been shown and described, and that all changes and modifications that come within the spirit of the invention are desired to be protected. Undoubtedly, many other "variations" on the "themes" set forth hereinabove will occur to one having ordinary skill in the art to which the present invention most nearly pertains, and such variations are intended to be within the scope of the invention, as disclosed herein.

For example, the concept of fabricating plated-up structures having long tails effecting routing can be extended in virtually an unlimited manner. For example, spring contact elements can be fabricated on a semiconductor device having a plurality of bond pads arranged along its periphery (in a peripheral pattern) so that the tips (free ends) of the spring contact elements are disposed in an area array arrangement, or vice-versa.

For example, the spring contact elements may be heat-treated to enhance their mechanical characteristics.

What is claimed is:

1. An electronic component, comprising:

a terminal on the electronic component;

a first remote area on the component which is remote from the terminal;

an electrical connection between the terminal and the first remote area; and a first spring contact element disposed at the first remote area, the spring contact element further comprising:

a precursor element, of a first material, attached to and extending from the first remote area; and a second material deposited in a form determined significantly by the precursor element, wherein the precursor element without the second material is flexible, and the second material is resilient.

2. The electronic component, according to claim 1, wherein:

the electrical connection comprises a conductive trace having a proximal end joined to the terminal; and the first remote area comprises a position on the conductive trace which is remote from the proximal end of the conductive line.

3. The electronic component, according to claim 1, further comprising:

a plurality of terminals on the electronic component;

a plurality of first remote areas on the electronic component;

a plurality of electrical connections, each of the plurality of electrical connections extending between selected ones of the terminals and selected ones of the first remote areas; and a plurality of spring contact elements, each of the plurality of spring contact elements disposed at a one of the remote areas.

4. The electronic component, according to claim 3, further comprising:

a first layer on the electronic component having a first pattern of first conductive traces;

a second layer on the electronic component having a second pattern of second conductive traces;

selected portions of the first conductive traces joined to selected ones of the terminals; and selected portions of the second conductive traces electrically connected to selected ones of the first conductive traces;

wherein the first remote areas are on the second conductive traces.

5. The electronic component, according to claim 4, further comprising:

a third layer on the electronic component having a third pattern of third conductive traces;

wherein the selected portions of the second conductive traces electrically are connected to the selected ones of the first conductive traces via selected portions of the third conductive layer.

6. The electronic component, according to claim 3, wherein:

the electrical connections comprise a plurality of conductive lines; and at least one of the plurality of conductive lines crosses over another one of the plurality of conductive lines without electrically contacting the other one of the conductive lines.

7. The electronic component, according to claim 3, wherein:

the spring contact elements are substantially identical to one another.

8. The electronic component, according to claim 3, wherein:

the plurality of terminals are disposed in a first pattern on the component;

each of the plurality of spring contact elements has a contact region, the contact region displaced away from the electronic component and moveable toward the electronic component;

the contact regions of the spring contact elements are arranged in a second pattern; and the second pattern is different from the first pattern.

9. The electronic component, according to claim 8, wherein:

the first pattern comprises a peripheral pattern having a first pitch; the second pattern comprises a peripheral pattern having a second pitch; and the second pitch is different than the first pitch.

10. The electronic component, according to claim 8, wherein:

the second pattern comprises a row.

11. The electronic component, according to claim 8, wherein:

the first pattern comprises a row.

12. The electronic component, according to claim 3, wherein:

each of the plurality of spring contact elements has a contact region, the contact region displaced away from the electronic component and moveable toward the electronic component;

the plurality of terminals are disposed in a peripheral pattern on the component; and the plurality of contact regions of the spring contact elements are arranged in an area array.

13. The electronic component, according to claim 1, further comprising:

a second remote area on the electronic component, the second remote area electrically connected to the terminal; and a second spring contact element disposed at the second remote area.

14. The electronic component, according to claim 1, wherein:

the first spring contact element is a composite interconnection element.

15. The electronic component, according to claim 1, wherein:

the first spring contact element is a plated-up structure.

16. The electronic component, according to claim 1, wherein:

the electronic component is selected from the group consisting of a semiconductor device, a memory chip, a portion of a semiconductor wafer, a space transformer, a probe card, a chip carrier, and a socket.

17. A semiconductor device with an integral contact element, comprising:

a semiconductor device;

a bond pad on the semiconductor device;

a conductive trace on the semiconductor device extending from the bond pad to a position which is remote from the terminal;

a spring contact element having a base end at a region of the conductive trace which is remote from the bond pad, the spring contact element having a contact region disposed above the surface of the substrate and offset from the base end, the spring contact element further comprising:

a precursor element, of a first material, attached to and extending from the first remote area; and a second material deposited in a form determined significantly by the precursor element, wherein the precursor element without the second material is flexible, and the second material forms a spring.

18. The semiconductor device, according to claim 17, wherein:

the spring contact element comprises a composite interconnection element.

19. The semiconductor device, according to claim 17, wherein:

the spring contact element comprises a plated-up structure.

20. The semiconductor device, according to claim 17, wherein:

the semiconductor device is a memory chip.

21. The electronic component, according to claim 1, wherein the first material includes a material selected from the group consisting of gold, aluminum and copper.

22. The electronic component, according to claim 1, wherein the spring contact element is resilient and the second material dominates the resiliency of the spring contact element.

23. The electronic component, according to claim 1, wherein the second material is stronger than the precursor element.

24. The electronic component, according to claim 1, wherein the second material is a coating which envelops the precursor element.

25. The electronic component, according to claim 1, wherein the second material comprises a material selected from the group consisting of nickel, cobalt and iron.

26. The electronic component, according to claim 1, wherein the second material is deposited directly on the precursor element.

27. The semiconductor device, according to claim 17, wherein the first material includes a material selected from the group consisting of gold, aluminum and copper.

28. The semiconductor device, according to claim 17, wherein the spring contact element is resilient and the second material dominates the resiliency of the spring contact element.

29. The semiconductor device, according to claim 17, wherein the second material is stronger than the precursor element.

30. The semiconductor device, according to claim 17, wherein the second material is a coating which envelops the precursor element.

31. The semiconductor device, according to claim 17, wherein the second material comprises a material selected from the group consisting of nickel, cobalt and iron.

32. The semiconductor device, according to claim 17, wherein the second material is deposited directly on the precursor element.

* * * * *